United States Patent
Choung et al.

(10) Patent No.: US 11,652,111 B2
(45) Date of Patent: May 16, 2023

(54) DISPLAY DEVICE

(71) Applicant: Samsung Display Co., LTD., Yongin-si (KR)

(72) Inventors: Jong Hyun Choung, Suwon-si (KR); Jae Uoon Kim, Hwaseong-si (KR); Hyun Ah Sung, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/462,803

(22) Filed: Aug. 31, 2021

(65) Prior Publication Data
US 2022/0157856 A1 May 19, 2022

(30) Foreign Application Priority Data
Nov. 13, 2020 (KR) .......................... 10-2020-0151971

(51) Int. Cl.
*H01L 27/12* (2006.01)
*H01L 25/16* (2006.01)
*H01L 27/32* (2006.01)

(52) U.S. Cl.
CPC ...... *H01L 27/1244* (2013.01); *H01L 27/1259* (2013.01); *H01L 25/167* (2013.01); *H01L 27/1248* (2013.01); *H01L 27/3276* (2013.01)

(58) Field of Classification Search
None
See application file for complete search history.

(56) References Cited

U.S. PATENT DOCUMENTS

| | | | | |
|---|---|---|---|---|
| 7,371,621 B2* | 5/2008 | Kim | ...................... | H01L 27/124 257/E29.147 |
| 2004/0080688 A1* | 4/2004 | Ishida | ................... | G02F 1/1345 216/13 |
| 2007/0075313 A1 | 4/2007 | Kwak et al. | | |
| 2014/0042439 A1 | 2/2014 | Misaki | | |

(Continued)

FOREIGN PATENT DOCUMENTS

| EP | 2 693 420 | 2/2014 |
|---|---|---|
| EP | 2 966 705 | 1/2016 |

(Continued)

OTHER PUBLICATIONS

Extended European Search Report, corresponding to European Application/Patent No. 21205658.4, dated Jul. 29, 2022.

*Primary Examiner* — Bo B Jang
(74) *Attorney, Agent, or Firm* — Kile Park Reed & Houtteman PLLC

(57) ABSTRACT

A display device includes a data conductive layer disposed on a substrate, a passivation layer disposed on the data conductive layer, a via layer disposed on the passivation layer, and a pixel electrode disposed on the via layer. The data conductive layer includes a data base layer, a data main metal layer disposed on the data base layer, a first data capping layer disposed on the data main metal layer, a second data capping layer disposed on the first data capping layer, and a third data capping layer disposed on the second data capping layer. The passivation layer and the via layer include a pad opening which exposes a portion of the data conductive layer in the pad area. The third data capping layer has a higher etch rate than the first and second data capping layers for a same etchant.

20 Claims, 25 Drawing Sheets

(56) References Cited

U.S. PATENT DOCUMENTS

| | | | |
|---|---|---|---|
| 2015/0115256 A1* | 4/2015 | You | H01L 29/45 |
| | | | 257/40 |
| 2016/0013436 A1 | 1/2016 | Im et al. | |
| 2016/0020422 A1 | 1/2016 | Kim et al. | |
| 2016/0351846 A1* | 12/2016 | Kim | H01L 27/3246 |
| 2017/0062548 A1 | 3/2017 | Han et al. | |
| 2017/0345882 A1 | 11/2017 | Nam et al. | |
| 2019/0097161 A1 | 3/2019 | Im et al. | |

FOREIGN PATENT DOCUMENTS

| | | |
|---|---|---|
| JP | 2008-39843 | 2/2008 |
| KR | 10-2020-0018749 | 2/2020 |
| KR | 10-2020-0049223 | 5/2020 |

* cited by examiner

DISPLAY DEVICE

CROSS-REFERENCE TO RELATED APPLICATION

This application claims priority to and the benefit of Korean Patent Application No. 10-2020-0151971 under 35 U.S.C. § 119, filed in the Korean Intellectual Property Office (KIPO) on Nov. 13, 2020, the entire contents of which are incorporated herein by reference.

BACKGROUND

1. Technical Field

The disclosure relates to a display device.

2. Description of the Related Art

Display devices are becoming more important with developments in multimedia technology. Accordingly, various display devices such as an organic light-emitting diode (OLED) display device, a liquid crystal display (LCD) device, and the like have been used.

Meanwhile, a display device includes a display panel such as an OLED display panel or an LCD panel that can display an image. A display panel includes light-emitting elements such as light-emitting diodes (LED), and the LEDs may be classified into OLEDs using an organic material as a fluorescent substance and inorganic LEDs using an inorganic material as a fluorescent substance.

SUMMARY

Embodiments of the disclosure provide a display device including a new pad electrode structure.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, the display device may comprise a substrate including a display area and a pad area, a data conductive layer disposed on the substrate, a passivation layer disposed on the data conductive layer, a via layer disposed on the passivation layer, and a pixel electrode disposed on the via layer. The data conductive layer may include a data base layer, a data main metal layer disposed on the data base layer, a first data capping layer disposed on the data main metal layer, a second data capping layer disposed on the first data capping layer, and a third data capping layer disposed on the second data capping layer. The passivation layer and the via layer may include a pad opening which exposes a portion of the data conductive layer in the pad area. The third data capping layer may have a higher etch rate than the first and second data capping layers for a same etchant and may include a pad conductive layer which does not overlap the pad opening.

In an embodiment, the third data capping layer may have a twice higher etch rate than the first and second data capping layers for the same etchant.

In an embodiment, the third data capping layer may include copper (Cu) or zinc indium oxide (ZIO).

In an embodiment, the data main metal layer and the third data capping layer may include copper.

In an embodiment, the third data capping layer may have a thickness in a range of about 10 Å to about 100 Å.

In an embodiment, the data base layer and the first data capping layer may include a same material and include at least one of titanium (Ti), tantalum (Ta), calcium (Ca), chromium (Cr), magnesium (Mg), and nickel (Ni).

In an embodiment, the data base layer and the first data capping layer may include titanium.

In an embodiment, the second data capping layer may include indium tin oxide (ITO).

In an embodiment, side surfaces of each layer of the data conductive layer may be aligned with each other.

In an embodiment, side surfaces of the passivation layer may be aligned with corresponding side surfaces of the pad conductive layer.

In an embodiment, the passivation layer may overlap the pad conductive layer, and side surfaces of the passivation layer protrude outwardly beyond side surfaces of the pad conductive layer.

According to an embodiment of the disclosure, the display device may comprise a substrate including a display area and a pad area, a data conductive layer disposed on the substrate, a passivation layer disposed on the data conductive layer, a via layer disposed on the passivation layer, and a pixel electrode disposed on the via layer. The data conductive layer may include a data base layer, a data main metal layer disposed on the data base layer, a first data capping layer disposed on the data main metal layer, a second data capping layer disposed on the first data capping layer, and a third data capping layer disposed on the second data capping layer. The passivation layer and the via layer may include a first contact hole which penetrates the passivation layer and the via layer in a thickness direction to expose a portion of the data conductive layer in the display area, and a pad opening which exposes portion of the data conductive layer in the pad area. The data conductive layer may include a first area which overlaps the passivation layer, a second area which overlaps the first contact hole, and a third area which overlaps the pad opening, the third data capping layer may be disposed in the entire first and second areas of the data conductive layer, and the third data capping layer may include a pad conductive layer which does not overlap the pad opening in the third area of the data conductive layer.

In an embodiment, the third data capping layer may contact the pixel electrode in the second area of the data conductive layer.

In an embodiment, the display device may further comprise a lower metal layer disposed on the substrate below the first area of the data conductive layer, and at least one insulating layer disposed between the data conductive layer and the lower metal layer.

In an embodiment, the at least one insulating layer may include a contact hole which penetrates the at least one insulating layer in the thickness direction to expose the lower metal layer, and the lower metal layer may be electrically connected to the data conductive layer through the contact hole.

In an embodiment, portions of the third data capping layer in the first and second areas of the data conductive layer and the pad conductive layer in the third area of the data conductive layer may include a same material.

In an embodiment, the third data capping layer may have a higher etch rate than the first and second data capping layers for a same etchant.

In an embodiment, the third data capping layer may include copper (Cu) or zinc indium oxide (ZIO).

In an embodiment, the data main metal layer and the third data capping layer may include copper.

In an embodiment, the third data capping layer may have a thickness in a range of about 10 Å to about 100 Å.

According to the aforementioned and other embodiments of the disclosure, as the profile of a data conductive layer is improved by preventing the formation of tips in the data conductive layer, cracks in a passivation layer can be prevented.

In addition, as a plurality of capping layers are formed on a main conductive layer that forms a wire pad to prevent the main conductive layer from being directly exposed to an etchant, damage to the main conductive layer can be prevented, and the reliability of the main conductive layer can be improved.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one" selected from the group of for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Embodiments of the disclosure will hereinafter be described with reference to the accompanying drawings.

Figure 1:
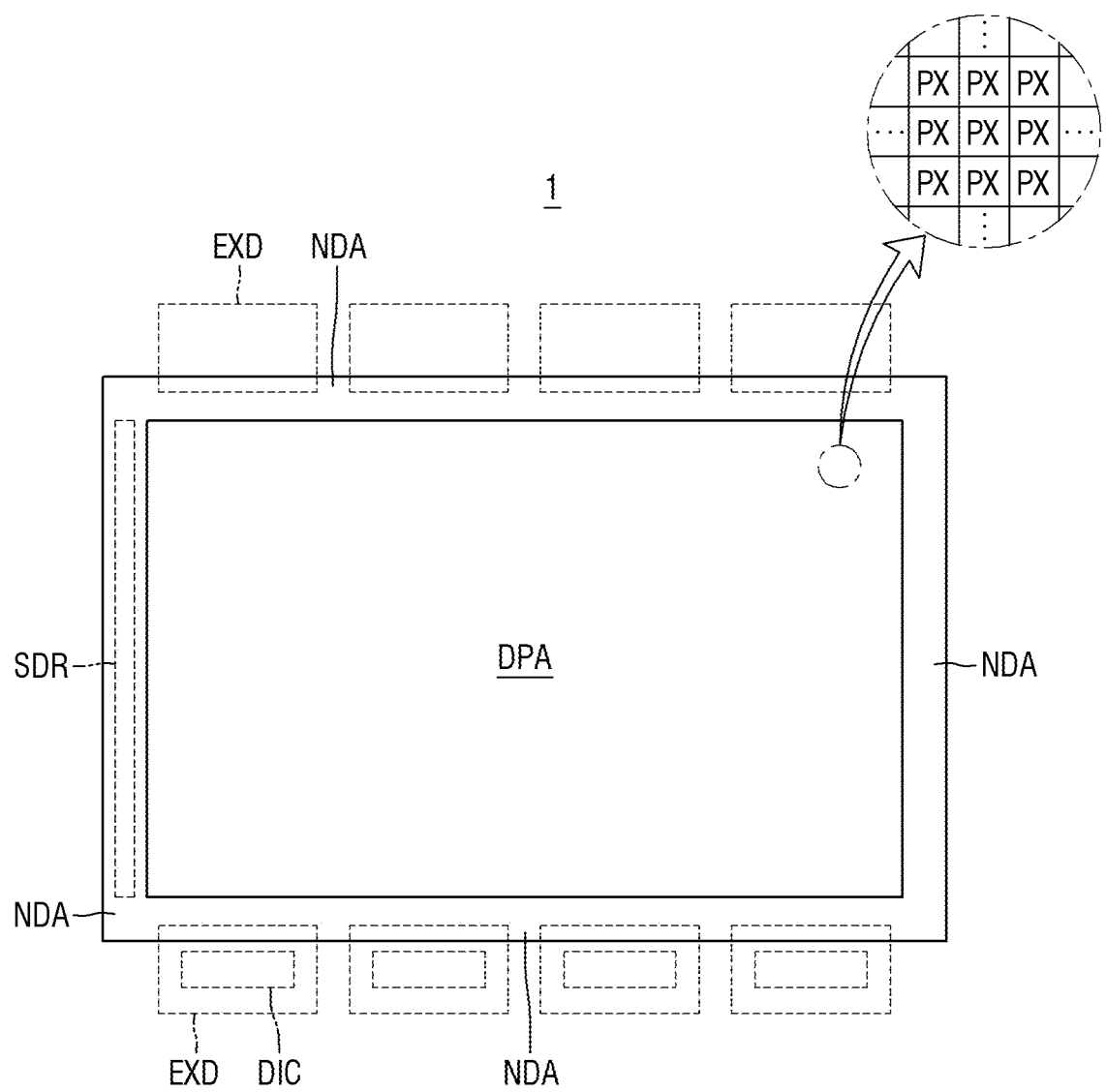
FIG. 1 is a schematic plan view of a display device according to an embodiment of the disclosure.

FIG. 1 is a schematic plan view of a display device according to an embodiment.

Referring to FIG. 1, a display device 1 may be applicable to a smartphone, a mobile phone, a tablet personal computer (PC), a personal digital assistant (PDA), a portable multimedia player (PMP), a television (TV), a gaming console, a wristwatch-type electronic device, a head-mounted display (HMD), a PC monitor, a laptop computer, a car navigation device, a car dashboard, a digital camera, a camcorder, an external billboard, an electronic display board, a medical device, an inspection device, or various home appliances (such as a refrigerator or a washing machine). The display device 1 will hereinafter be described as being, for example, a TV having a high or ultrahigh resolution (such as high definition (HD), ultra-high definition (UHD), 4K, or 8K).

The display device 1 may be classified in various manners depending on how it displays an image. The display device 1 may be, for example, an organic light-emitting diode (OLED) display device, an inorganic light-emitting diode (LED) display device, a quantum dot emitting (QED) display device, a micro-LED display device, a nano-LED display device, a plasma display panel (PDP) device, a field emission display (FED) device, a cathode ray tube (CRT) display device, a liquid crystal display (LCD) device, or an electrophoretic display (EPD) device. The display device 1 will hereinafter be described as being, for example, an OLED display device, and an OLED display device will hereinafter be referred to simply as a display device unless specified otherwise. However, the disclosure is not limited to this, and various other display devices may also be used as the display device 1 without departing from the scope of the disclosure.

The display device 1 may have a square shape, for example, a rectangular shape, in a plan view. In case that the display device 1 is a TV, the long sides of the display device 1 may be arranged in a horizontal direction, but the disclosure is not limited thereto. As another example, the long sides of the display device 1 may be arranged in a vertical direction, or the display device 1 may be rotatably installed so that the long sides thereof may be arranged horizontally or vertically.

The display device 1 may include a display area DPA and a non-display area NDA. The display area DPA may be an active area in which an image is displayed. The display area DPA may have a similar shape to the display device 1, for example, a rectangular shape, in a plan view, but the disclosure is not limited thereto.

The display area DPA may include pixels PX. The pixels PX may be arranged in row and column directions. The pixels PX may have a rectangular or square shape in a plan view, but the disclosure is not limited thereto. As another example, the pixels PX may have a rhombic shape having sides inclined with respect to the directions of the sides of the display device 1. The pixels PX may include pixels PX of various colors. In an example, the pixels PX may include a first-color pixel PX (e.g., a red pixel), a second-color pixel PX (e.g., a green pixel), and a third-color pixel PX (e.g., a blue pixel). The first-color pixel PX, the second-color pixel PX, and the third-color pixel PX may be alternately arranged in a stripe or PenTile® fashion.

The non-display area NDA may be disposed around the display area DPA. The non-display area NDA may surround a least a portion of the display area DPA or the entire display area DPA. The display area DPA may have a rectangular shape, and the non-display area NDA may be disposed adjacent to the four sides of the display area DPA. The non-display area NDA may form the bezel of the display device 1.

In the non-display area NDA, driving circuits or elements for driving the display area DPA may be disposed. In an example, in first and second non-display areas adjacent to first and second long sides (e.g., the bottom and top sides of FIG. 1) of the display device 1, respectively, pad parts may be provided on a display substrate of the display device 1, and external devices EXD may be mounted on pad electrodes of the pad parts. Examples of the external devices EXD may include connecting films, printed circuit boards (PCBs), driver integrated circuits DIC, connectors, and wiring connecting films. In an example, in a third non-display area NDA adjacent to a first short side (e.g., the left side of FIG. 1) of the display device 1, a scan driver SDR may be disposed. The scan driver SDR may be formed directly on the display substrate of the display device 1.

Figure 2:
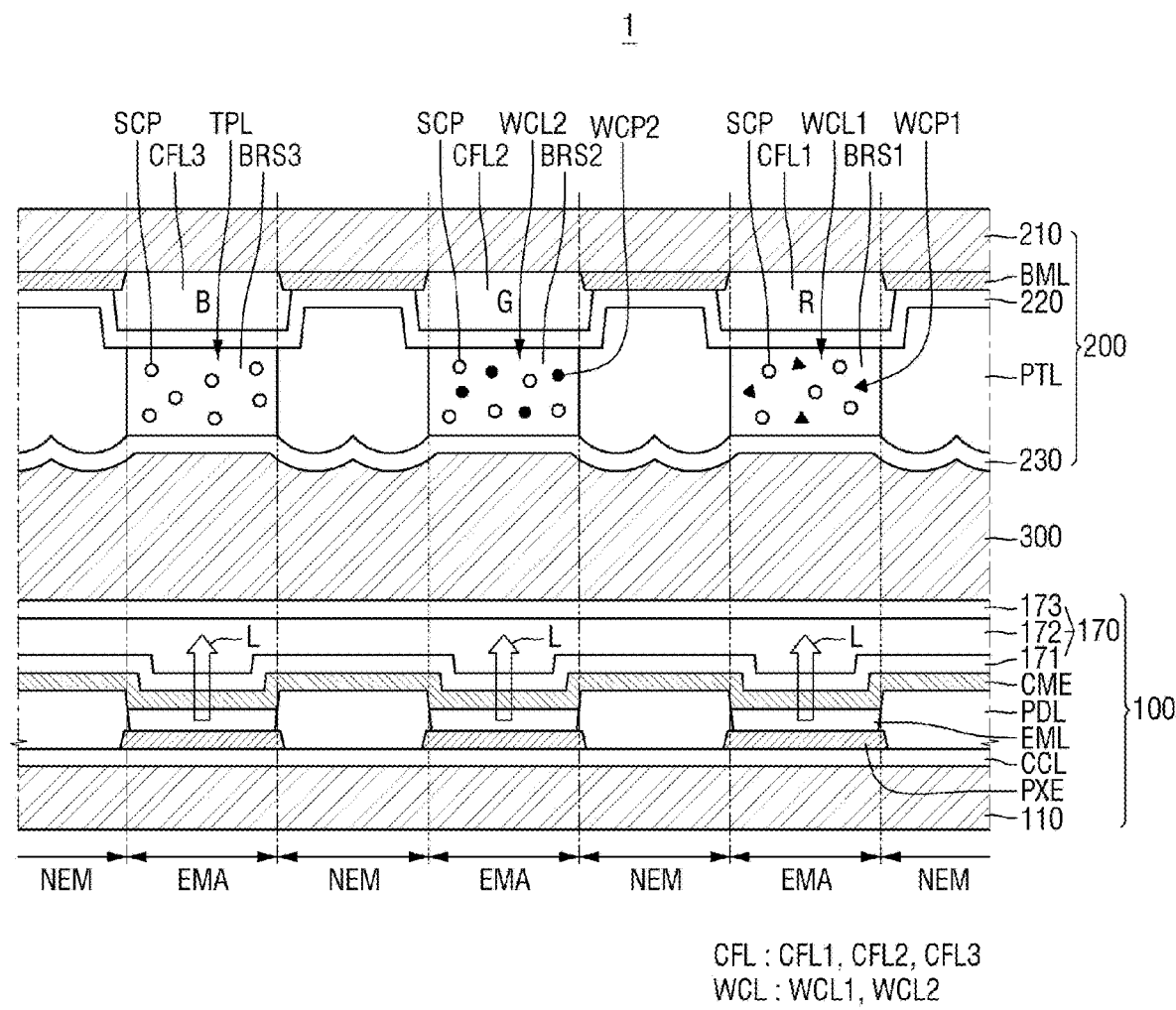
FIG. 2 is a schematic cross-sectional view of the display device of FIG. 1.

FIG. 2 is a schematic cross-sectional view of a display device of FIG. 1.

FIG. 2 illustrates that the display device 1 is a top emission-type display device emitting light L in a direction away from a first substrate 110 in which light-emitting layers EML are formed, for example, a direction toward a second substrate 210, but the disclosure is not limited thereto. As another example, the display device 1 may be a bottom emission-type display device emitting light L in the direction toward the first substrate 110 or a double-sided emission-type display device emitting light L in both the direction toward the first substrate 110 and the direction toward the second substrate 210.

Referring to FIG. 2, the display device 1 may include a first display substrate 100, a second display substrate 200, which faces the first display substrate 100, and a filling layer 300, which bonds the first and second display substrates 100 and 200.

The first display substrate 100 may include the first substrate 110. The first substrate 110 may be an insulating substrate. The first substrate 110 may include a transparent material. In an example, the first substrate 110 may include a transparent insulating material such as glass or quartz. The first substrate 110 may be a rigid substrate. However, the disclosure is not limited to this. In an example, the first substrate 110 may include plastic such as polyimide or may be flexible (or bendable, foldable, or rollable).

Pixel electrodes PXE may be disposed on the first substrate 110. The pixel electrodes PXE may be disposed in their respective pixels PX. The pixel electrodes PXE of adjacent pixels PX may be separated from one another. A circuit layer CCL, which drives the pixels PX, may be disposed on the first substrate 110. The circuit layer CCL may be disposed between the first substrate 110 and the pixel electrodes PXE. The circuit layer CCL will be described below.

The pixel electrodes PXE may be first electrodes of LEDs, for example, anode electrodes. The pixel electrodes PXE may have a structure in which a layer of a high-work function material such as indium tin oxide (ITO), indium zinc oxide (IZO), zinc oxide (ZnO), or indium oxide ($In_2O_3$) and a layer of a reflective material such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof are stacked. The high-work function layer may be disposed above the reflective layer to be close to the light-emitting layers EML. The pixel electrodes PXE may have a multi-layer structure of ITO/Mg, ITO/MgF, ITO/Ag, or ITO/Ag/ITO, but the disclosure is not limited thereto.

A pixel-defining layer PDL may be disposed on a surface of the first substrate 110 along the boundaries of each of the pixels PX. The pixel-defining layer PDL may be disposed on the pixel electrodes PXE and may include openings that expose the pixel electrodes PXE. Emission areas EMA and non-emission areas NEM may be defined by the pixel-defining layer PDL and the openings of the pixel-defining layer PDL. The pixel-defining layer PDL may include an organic insulating material such as an acrylic resin, an epoxy resin, a phenolic resin, a polyamide resin, a polyimide resin, an unsaturated polyester resin, a polyphenylene resin, a polyphenylene sulfide resin, or benzocyclobutene (BCB). The pixel-defining layer PDL may include an inorganic material.

The light-emitting layers EML may be disposed on portions of the pixel electrodes PXE that are exposed by the pixel-defining layer PDL. In case that the display device 1 is an OLED display device, the light-emitting elements EML may include organic layers that include an organic material. The organic layers may include organic light-emitting layers and may further include hole injection holes, hole transport layers, electron transport layers, and/or electron injection layers as auxiliary layers for assisting with the emission of light. As another example, in case that the display device 1 is a micro- or nano-LED display device, the light-emitting layers EML of the display device 1 may include an inorganic material such as an inorganic semiconductor.

In some embodiments, the light-emitting layers EML may have a tandem structure including organic light-emitting layers that are stacked in a thickness direction and a charge-generating layer disposed between the organic light-emitting layers. The organic light-emitting layers may emit light of a same wavelength or different wavelengths. At least some of the layers of each of the light-emitting layers EML may be separated from one another between the adjacent pixels PX.

In an example, the wavelength of light emitted by the light-emitting layers EML may be the same for each pixel PX. In an example, the light-emitting layers EML may emit blue light or ultraviolet (UV) light, and a color control structure that will be described below may include wavelength conversion layers WCL. In this example, different color-pixels PX may display different colors.

In an example, the wavelength of light emitted by the light-emitting layers EML may differ from one pixel PX to another pixel PX. For example, the light-emitting layer EML of the first-color pixel PX may emit light of a first color, the light-emitting layer EML of the second-color pixel PX may emit light of a second color, and the light-emitting layer EML of the third-color pixel PX may emit light of a third color.

A common electrode CME may be disposed on the light-emitting layers EML. The common electrode CME may contact not only the light-emitting layers EML, but also the top surface of the pixel-defining layer PDL.

The common electrode CME may be connected throughout the pixels PX. The common electrode CME may be a full electrode disposed on the entire surface of the first substrate 110 without regard to the distinction between the pixels PX. The common electrode CME may be second electrodes of LEDs, for example, cathode electrodes.

The common electrode CME may include a layer of a low-work function material (or low-work function layer) including materials such as Li, Ca, lithium fluoride/calcium (LiF/Ca), lithium fluoride/aluminum (LiF/Al), Al, Mg, Ag, Pt, Pd, Ni, Au, Nd, Ir, Cr, barium fluoride (BaF), barium (Ba), or a compound or mixture thereof (e.g., a mixture of Ag and Mg). The common electrode CME may further include a transparent metal oxide layer disposed on the low-work function layer.

The pixel electrodes PXE, the light-emitting layers EML and the common electrode CME may form light-emitting elements (e.g., OLEDs). Light emitted by the light-emitting layers EML may be emitted in an upward direction through the common electrode CME.

A thin-film encapsulation structure 170 may be disposed on the common electrode CME. The thin-film encapsulation structure 170 may include one or more thin-film encapsulation layers. In an example, the thin-film encapsulation layers may include a first inorganic layer 171, an organic layer 172, and a second inorganic layer 173. The first and second inorganic layers 171 and 173 may include silicon nitride ($SiN_x$), silicon oxide ($SiO_x$), or silicon oxynitride ($SiO_xN_y$). The organic layer 172 may include an organic insulating material such as an acrylic resin, an epoxy resin, a phenolic resin, a polyamide resin, a polyimide resin, an unsaturated polyester resin, a polyphenylene resin, a polyphenylene sulfide resin, or BCB.

The second display substrate 200 may be disposed above the thin-film encapsulation structure 170 to face the thin-film encapsulation structure 170. The second substrate 210 of the second display substrate 200 may include a transparent material. The second substrate 210 may include a transparent insulating material such as glass or quartz. The second substrate 210 may be a rigid substrate. However, the disclosure is not limited to this. As another example, the second substrate 210 may include plastic such as polyimide or may be flexible (or bendable, foldable, or rollable).

The second substrate 210 and the first substrate may be the same, or the second substrate 210 may be different from the first substrate 110 in terms of material, thickness, and transmissivity. In an example, the second substrate 210 may have a higher transmissivity than the first substrate 110. The second substrate 210 may be thicker or thinner than the first substrate 110.

A light-blocking member BML may be disposed on a surface of the second substrate 210 that faces the first substrate 110, along the boundaries of each of the pixels PX. The light-blocking member BML may overlap the pixel-defining layer PDL of the first display substrate 100 and may be disposed in the non-emission areas NEM. The light-blocking member BML may include openings that expose portions of the surface of the second substrate 210 that overlap the emission areas EMA. The light-blocking member BML may be formed in a lattice shape in a plan view.

The light-blocking member BML may include an organic material. The light-blocking member BML may absorb external light and may thereby reduce color distortion that may be caused by the reflection of external light. The light-blocking member BML may prevent light, emitted by the light-emitting layer EML of a pixel PX, from penetrating into neighboring pixels PX.

In an example, the light-blocking member BML may absorb all visible wavelengths. The light-blocking member BML may include a light-absorbing material. In an example, the light-blocking member BML may be formed of a material that may be used as the black matrix of the display device 1.

In an example, the light-blocking member BML may absorb light of a particular visible wavelength and may transmit light of another particular visible wavelength therethrough. The light-blocking member BML and a color filter layer CFL may include a same material. Specifically, the light-blocking member BML and a blue filter layer (see a third color filter layer CFL3 of FIG. 2) may include a same material. In some embodiments, the light-blocking member BML may be integral with the blue filter layer CFL3. In some embodiments, the light-blocking member BML may not be provided.

Color filter layers CFL may be disposed on the surface of the second substrate 210 where the light-blocking member BML is disposed. The color filter layers CFL may be disposed on the portions of the surface of the second substrate 210 that are exposed by the openings of the light-blocking member BML. The color filter layers CFL may be disposed even on the light-blocking members BML.

The color filter layers CFL may include a first color filter layer CFL1, which is disposed in a first-color pixel PX, a second color filter layer CFL2, which is disposed in a second-color pixel PX, and the third color filter layer CFL3, which is disposed in a third-color pixel PX. The color filter layers CFL may include a colorant such as a pigment or dye capable of absorbing all wavelengths except for a particular designated wavelength (or predetermined wavelength). The first color filter layer CFL1 may be a red filter layer, the second color filter layer CFL2 may be a green filter layer, and the third color filter layer CFL3 may be a blue filter layer. The color filter layers CFL are illustrated as being disposed on the light-blocking members BML to be spaced apart from one another, but in an embodiment, they may at least partially overlap one another on the light-blocking members BML.

A first capping layer 220 may be disposed on the color filter layers CFL. The first capping layer 220 may prevent the color filter layers CFL from being damaged or polluted by impurities from the outside such as moisture or air. The first capping layer 220 may prevent the colorants of the color filter layers CFL from diffusing into other elements.

The first capping layer 220 may directly contact surfaces (e.g., the bottom surfaces of FIG. 2) of the color filter layers CFL. The first capping layer 220 may be formed of an inorganic material. In an example, the first capping layer 220 may include silicon nitride, aluminum nitride, zirconium nitride, titanium nitride, hafnium nitride, tantalum nitride, silicon oxide, aluminum oxide, titanium oxide, tin oxide, or silicon oxynitride.

A partition wall PTL may be disposed on the first capping layer 220. The partition wall PTL may be disposed in the non-emission areas NEM. The partition walls PTL may overlap the light-blocking member BML. The partition walls PTL may include openings that expose the color filter layers CFL. The partition wall PTL may include a photosensitive organic material, but the disclosure is not limited thereto. The partition wall PTL may further include a light-blocking material.

The wavelength conversion layers WCL and a light-transmitting layer TPL may be disposed in spaces exposed by the openings of the partition wall PTL. The wavelength conversion layers WCL and the light-transmitting layer TPL may be formed by an inkjet printing process using the partition wall PTL as a bank, but the disclosure is not limited thereto.

In case that the light-emitting layers EML of the pixels PX emit light of the third color, the wavelength conversion layers WCL may include first and second wavelength conversion patterns WCL1 and WCL2, which are disposed in the first- and second-color pixels PX, respectively. The light-transmitting layer TPL may be disposed in the third-color pixel PX.

The first wavelength conversion pattern WCL1 may include a first base resin BRS1 and a first wavelength conversion material WCP1, which is disposed in the first base resin BRS1. The second wavelength conversion pattern WCL2 may include a second base resin BRS2 and a second wavelength conversion material WCP2, which is disposed in the second base resin BRS2. The light-transmitting layer TPL may include a third base resin BRS3 and a scatterer material (or scatterer) SCP, which is disposed in the third base resin BRS3.

The first, second, and third base resins BRS1, BRS2, and BRS3 may include a transparent organic material. In an example, the first, second, and third base resins BRS1, BRS2, and BRS3 may include an epoxy resin, an acrylic resin, a cardo resin, or an imide resin. The first, second, and third base resins BRS1, BRS2, and BRS3 may include a same material, but the disclosure is not limited thereto.

The scatterer SCP may be particles of a metal oxide or an organic material. The metal oxide may be titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$), and the organic material may be an acrylic resin or a urethane resin.

The first wavelength conversion material WCP1 may be a material converting the third color into the first color, and the second wavelength conversion material WCP2 may be a material converting the third color into the second color. The first and second wavelength conversion materials WCP1 and WCP2 may be quantum dots, quantum rods, phosphors, or the like. The quantum dots may include group IV nanocrystals, group II-VI compound nanocrystals, group III-V compound nanocrystals, group IV-VI nanocrystals, or a combination thereof. The first and second wavelength conversion patterns WCL1 and WCL2 may further include the scatterer SCP.

The light-transmitting layer TPL, which is disposed in the third-color pixel PX, transmits therethrough light of the third color incident from the light-emitting layer EML of the third-color pixel PX, while maintaining the wavelength of the incident light. The scatterer SCP of the light-transmitting layer TPL may control the path of light being output through the light-transmitting layer TPL. The light-transmitting layer TPL may not include a wavelength conversion material.

A second capping layer 230 may be disposed on the wavelength conversion layers WCL, the light-transmitting layer TPL, and the partition wall PTL. The second capping layer 230 may be formed of an inorganic material. The second capping layer 230 may include a material selected from among the aforementioned materials of the first capping layer 220. The second capping layer 230 and the first capping layer 220 may be formed of a same material, but the disclosure is not limited thereto.

The filler layer 300 may be disposed between the first and second display substrates 100 and 200. The filler layer 300 may fill a space between the first and second display substrates 100 and 200 and may bond and couple the first and second display substrates 100 and 200. The filler layer 300 may be disposed between the thin-film encapsulation structure 170 and the second capping layer 230 of the second display substrate 200. The filler layer 300 may be formed of a silicon (Si)-based organic material or an epoxy-based organic material, but the disclosure is not limited thereto.

The circuit layer CCL of the display device 1 will hereinafter be described below.

Figure 3:
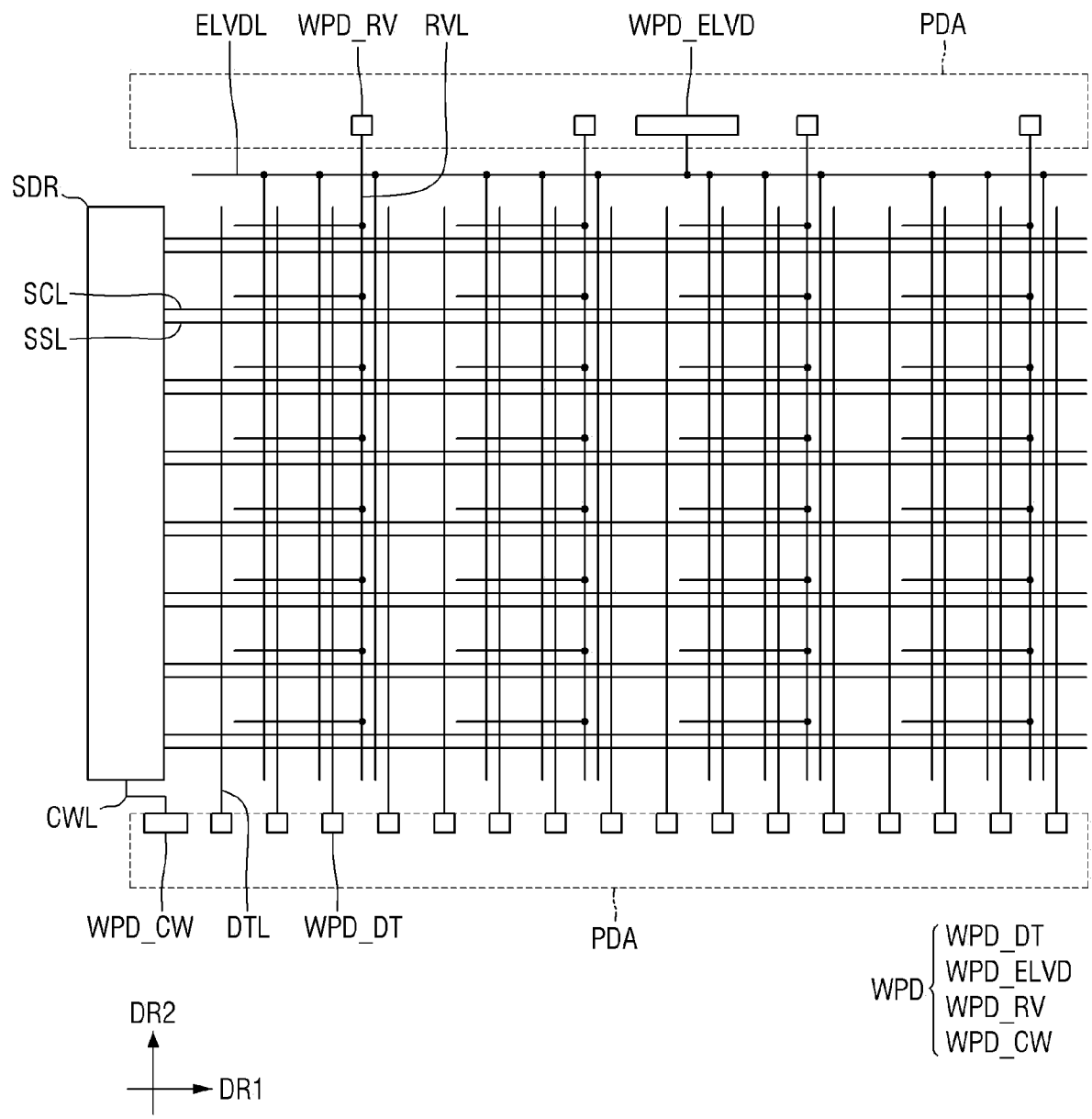
FIG. 3 is a schematic layout view of a circuit layer of a first display substrate of the display device of FIG. 1.

FIG. 3 is a schematic layout view of a circuit layer of a first display substrate of a display device according to an embodiment.

Referring to FIG. 3, lines may be disposed on the first substrate 110. The lines may include scan lines SCL, sensing signal lines SSL, data lines DTL, reference voltage lines RVL, and a first power supply line ELVDL.

The scan lines SCL and the sensing signal lines SSL may extend in a first direction DR1. The scan lines SCL and the sensing signal lines SSL may be electrically connected to the scan driver SDR. The scan driver SDR may include driving circuits formed as the circuit layer CCL. The scan driver SDR may be disposed in the third non-display area NDA on the first substrate 110, but the disclosure is not limited thereto. As another example, the scan driver SDR may be disposed in a fourth non-display area NDA or in both the third and fourth non-display areas NDA. The scan driver SDR may be electrically connected to a signal connecting line CWL, and at least one end of the signal connecting line CWL may form a pad WPD_CW in the first non-display area NDA and/or the second non-display area NDA and may be electrically connected to the external devices EXD of FIG. 1.

The data lines DTL and the reference voltage lines RVL may extend in a second direction DR2, which intersects the first direction DR1. The first power supply line ELVDL may extend portions that extend in the second direction DR2. The first power supply line ELVDL may further include portions that extend in the first direction DR1. The first power supply line ELVDL may have a mesh structure, but the disclosure is not limited thereto.

Wire pads WPD may be disposed at least one end of each of the data lines DTL, the reference voltage line RVL and the first power supply line ELVDL. The wire pads WPD may be disposed in a pad area PDA of the non-display area NDA. Wire pads WPD_DT (hereinafter referred to as data pads WPD_DT) of the data lines DTL may be disposed in the pad area PDA of the first non-display area NDA, and wire pads WPD_RV (hereinafter referred to as reference voltage pads WPD_RV) of the reference voltage lines RVL and a wire pad WPD_ELVD (hereinafter referred to as first power supply pad WPD_ELVD) of the first power supply line ELVDL may be disposed in the pad area PDA of the second non-display area NDA. As another example, the data pads WPD_DT, the reference voltage pads WPD_RV, and the first power supply pad WPD_ELVD may all be disposed in a same area, for example, the first non-display area NDA. The external devices EXD of FIG. 1 may be mounted on the wire pads WPD. The external devices EXD may be mounted on the wire pads WPD by anisotropic conductive films or ultrasonic bonding.

The pixels PX on the first substrate 110 may include pixel driving circuits. The lines may pass by the pixels PX to apply driving signals to the pixel driving circuits. Each of the pixel driving circuits may include transistors and capacitors. The numbers of transistors and capacitors in each of the pixel driving circuits may vary. The pixel driving circuits will hereinafter be described as having a "3T1C" structure with three transistors and a capacitor, but the disclosure is not limited thereto. As another example, various modified pixel structures such as "2T1C", "7T1C", or "6T1C" structure may be applied to the pixel driving circuits.

Figure 4:
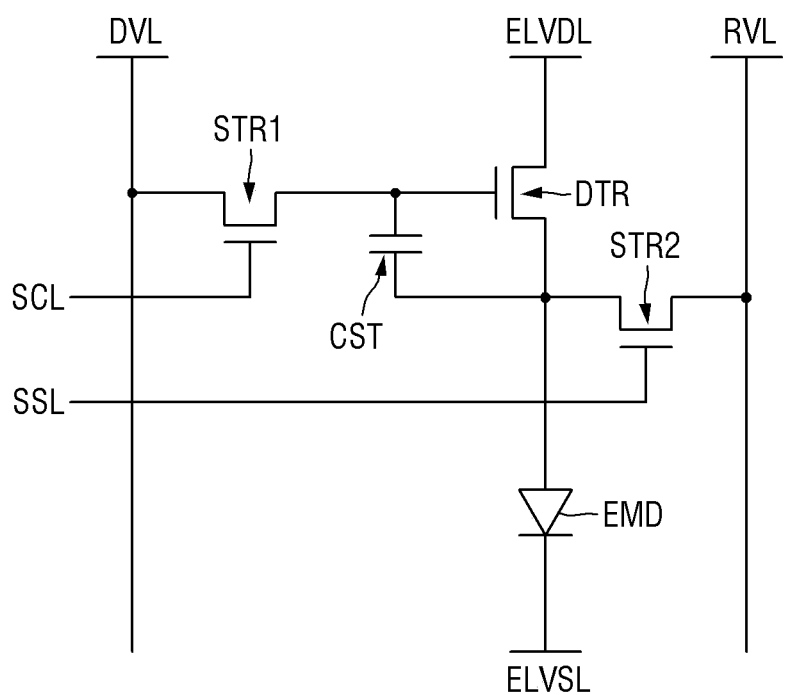
FIG. 4 is a schematic equivalent circuit diagram of a pixel of the display device of FIG. 1.

FIG. 4 is a schematic diagram of an equivalent circuit of a pixel of a display device according to an embodiment.

Referring to FIG. 4, a pixel PX of the display device may include a light-emitting element EMD and may further include three transistors, for example, a driving transistor DTR, a first switching transistor STR1, and a second switching transistor STR2, and a storage capacitor CST.

The light-emitting element EMD may emit light in accordance with a current applied thereto via the driving transistor DTR. The light-emitting element EMD may be implemented as an OLED, a micro-LED, or a nano-LED.

The first electrode (for example, the anode electrode) of the light-emitting element EMD may be electrically connected to a source electrode of the driving transistor DTR, and a second electrode (for example, the cathode electrode) of the light-emitting element EMD may be electrically connected to a second power supply line ELVSL, to which a low-potential voltage (or a second power supply voltage) lower than a high-potential voltage (or a first power supply voltage) from the first power supply line ELVDL is applied.

The driving transistor DTR may control a current that flows from the first power supply line ELVDL, to which the first power supply voltage is applied, to the light-emitting element EMD in accordance with the difference in voltage between a gate electrode and the source electrode thereof. The gate electrode of the driving transistor DTR may be electrically connected to a first source/drain electrode of the first switching transistor STR1, the source electrode of the driving transistor DTR may be electrically connected to a first electrode of the light-emitting element EMD, and a drain electrode of the driving transistor DTR may be electrically connected to the first power supply line ELVDL, to which the first power supply voltage is applied.

The first switching transistor STR1 may be turned on by a scan signal from a scan line SCL and electrically connect a data line DTL to the gate electrode of the driving transistor DTR. A gate electrode of the first switching transistor STR1 may be electrically connected to the scan line SCL, the first source/drain electrode of the first switching transistor STR1 may be electrically connected to the gate electrode of the driving transistor DTR1, and a second source/drain electrode of the first switching transistor STR1 may be electrically connected to the data line DTL.

The second switching transistor STR2 may be turned on by a sensing signal from a sensing signal line SSL electrically connect a reference voltage line RVL to the source electrode of the driving transistor DTR. A gate electrode of the second switching transistor STR2 may be electrically connected to the sensing signal line SSL, a first source/drain electrode of the second switching transistor STR2 may be electrically connected to the reference voltage line RVL, and a second source/drain electrode of the second switching transistor STR2 may be electrically connected to the source electrode of the driving transistor DTR.

The first source/drain electrodes of the first and second transistors STR1 and STR2 may be source electrodes, and the second source/drain electrodes of the first and second transistors STR1 and STR2 may be drain electrodes. However, the disclosure is not limited thereto. As another example, the first source/drain electrodes of the first and second transistors STR1 and STR2 may be drain electrodes, and the second source/drain electrodes of the first and second transistors STR1 and STR2 may be source electrodes.

The storage capacitor CST may be formed between the gate electrode and the source electrode of the driving transistor DTR. The storage capacitor CST may store a differential voltage corresponding to the difference between gate and source voltages of the driving transistor DTR.

The driving transistor DTR and the first and second switching transistors STR1 and STR2 may be formed as thin-film transistors (TFTs). FIG. 3 illustrates that the driving transistor DTR and the first and second switching transistors STR1 and STR2 are N-type metal oxide semiconductor field-effect transistors (MOSFETs), but the disclosure is not limited thereto. As another example, the driving transistor DTR and the first and second switching transistors STR1 and STR2 may be P-type MOSFETs. As another example, some of the driving transistor DTR and the first and second switching transistors STR1 and STR2 may be N-type MOSFETs, and the other transistor(s) may be P-type MOSFETs.

Figure 5:
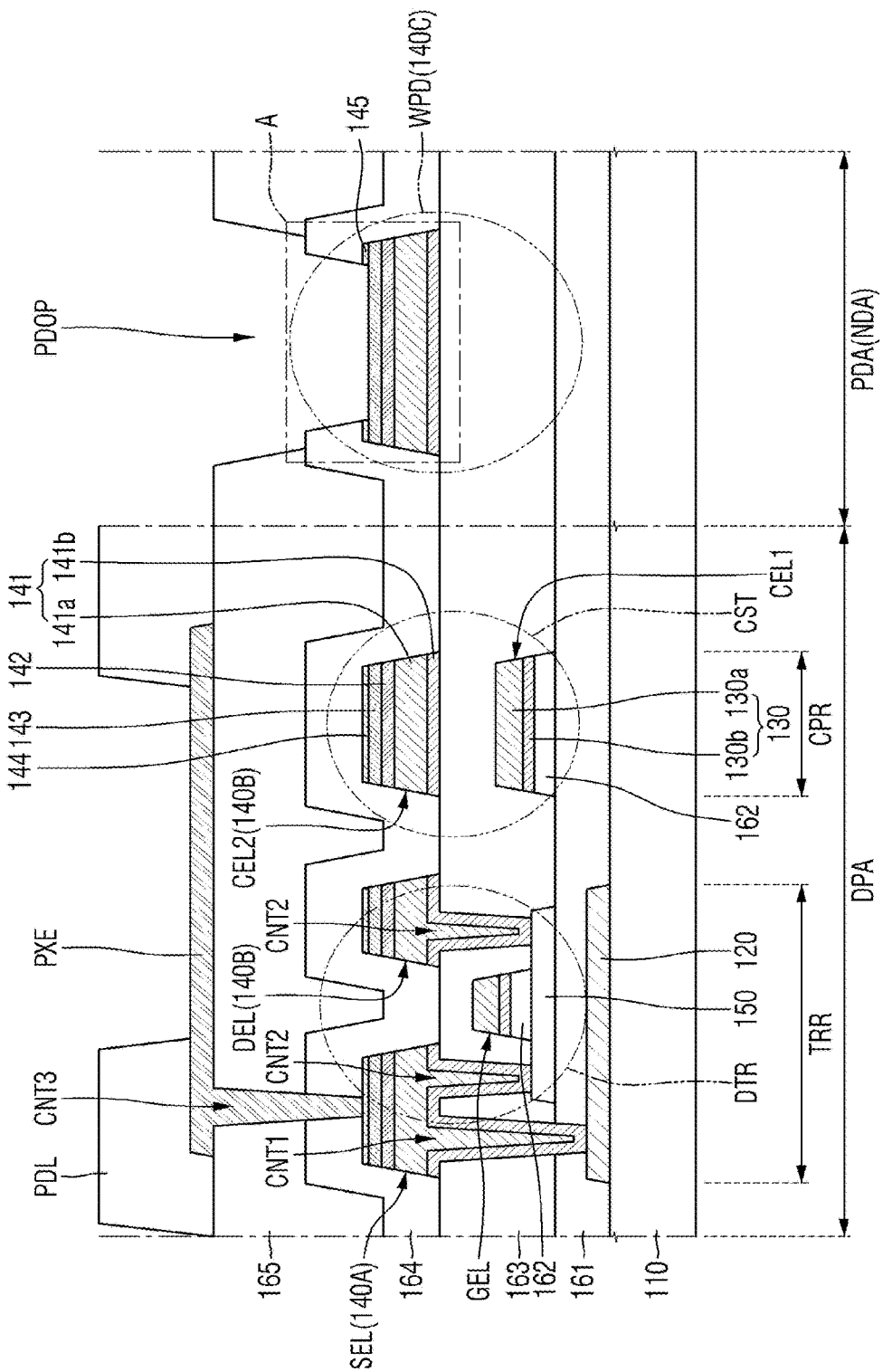
FIG. 5 is a schematic cross-sectional view of the first display substrate of the display device of FIG. 1.
Figure 6:
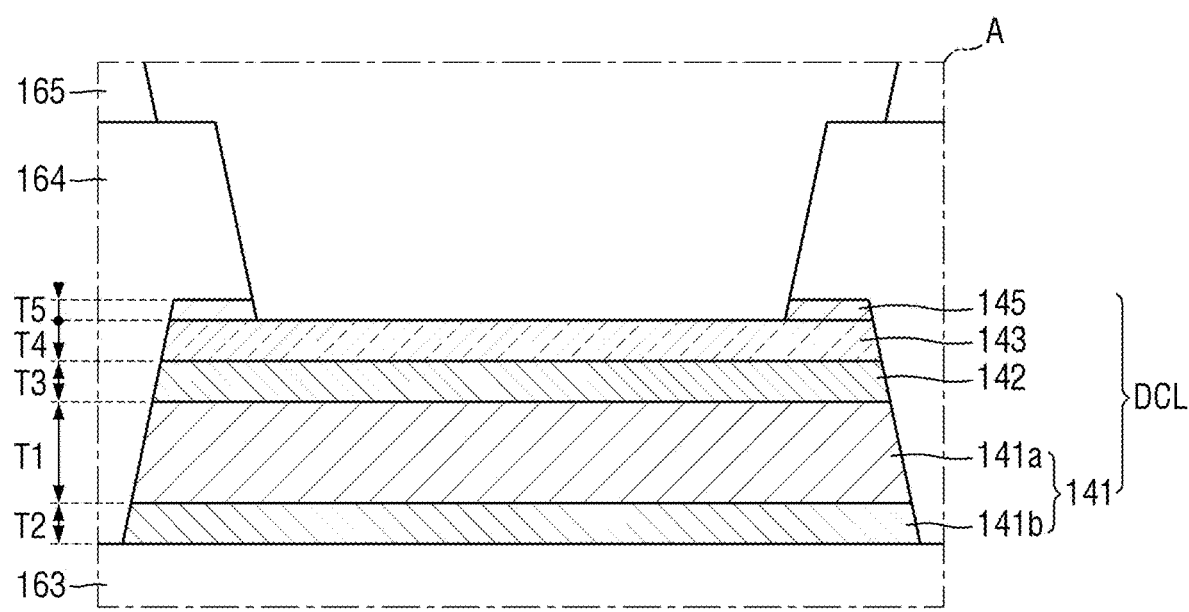
FIG. 6 is a schematic enlarged view of part A of FIG. 5.

FIG. 5 is a schematic cross-sectional view of a first display substrate of a display device according to an embodiment. FIG. 6 is a schematic enlarged view of part A of FIG. 5.

FIG. 5 illustrates a portion of the display area DPA and a portion of the non-display area NDA. FIG. 5 illustrates a transistor region TRR and a capacitor region CPR of a pixel PX as a portion of the display area DPA and illustrates the pad area PDA as a portion of the non-display area NDA. The transistor region TRR of FIG. 5 may be a region where one of three transistors of the pixel PX, particularly, a driving transistor DTR, is disposed. For convenience, FIG. 5 mainly illustrates the circuit layer CCL of the first display substrate 100, up to the pixel-defining layer PDL. FIG. 6 illustrates a wire pad WPD disposed in the pad area PDA of FIG. 5.

Referring to FIG. 5, the circuit layer CCL may include a semiconductor layer 150, conductive layers, and insulating layers, which are disposed on the first substrate 110. The semiconductor layer 150 may include an oxide semiconductor. The conductive layers may include a lower metal layer 120, a gate conductive layer GCL, a data conductive layer DCL, and a pixel electrode PXE. The insulating layers may include a buffer layer 161, a gate insulating layer 162, an interlayer insulating layer 163, a passivation layer 164, and a via layer 165.

Specifically, the lower metal layer 120 may be disposed on the first substrate 110. The lower metal layer 120 may be a light-shielding layer capable of protecting the semiconductor layer 150 from light from below or within the circuit layer CCL. The lower metal layer 120 may have a patterned shape. The lower metal layer 120 may be disposed in the transistor region TRR. The lower metal layer 120 may overlap the semiconductor layer 150, which is disposed above the lower metal layer 120, and may cover or overlap the semiconductor layer 150 from below the semiconductor layer 150. The lower metal layer 120 may cover or overlap at least a channel region of the semiconductor layer 150 from below the semiconductor layer 150 or cover or overlap the entire semiconductor layer 150. The lower metal layer 120 may be electrically connected to a source electrode SEL of the driving transistor DTR through a first contact hole CNT1 and may suppress a change in the voltage of the driving transistor DTR. The lower metal layer 120 may be formed of a low-reflective material capable of reducing the reflection of light. In an example, the lower metal layer 120 may be formed as a double layer of titanium (Ti)/copper (Cu) in which a Ti layer and a Cu layer are stacked, but the disclosure is not limited thereto. In an example, the lower metal layer 120 may be formed as a triple layer of Ti/Cu/Ti or a single layer of Cu.

The buffer layer 161 may be disposed on the lower metal layer 120. The buffer layer 161 may cover or overlap the entire surface of the first substrate 110 with the lower metal layer 120 formed thereon. The buffer layer 161 may include silicon nitride, silicon oxide, or silicon oxynitride. In an example, the buffer layer 161 may include a double layer of $SiN_x/SiO_x$.

The semiconductor layer 150 may be disposed on the buffer layer 161. The semiconductor layer 150 may be disposed in the transistor region TRR and may include the channel region of the driving transistor DTR. The semiconductor layer 150 may include an oxide semiconductor, and the oxide semiconductor may include, for example, a binary compound ($AB_x$), a tertiary compound ($AB_xC_y$), or a quaternary compound ($AB_xC_yD_z$) containing indium (In), zinc (Zn), gallium (Ga), Ti, Al, hafnium (Hf), zirconium (Zr), or Mg. In an embodiment, the semiconductor layer 150 may include indium gallium zinc oxide (IGZO).

The gate insulating layer 162 may be disposed on the buffer layer 161. The gate insulating layer 162 and the gate conductive layer GCL may be formed to have a same pattern, which will be described below. The gate insulating layer 162 disposed in the transistor region TRR may be disposed on the semiconductor layer 150, and the gate insulating layer 162 disposed in the capacitor region CPR may be disposed on the buffer layer 161. The sidewalls of the gate insulating layer 162 may be generally aligned with the sidewalls of the gate conductive layer GCL, for example, the sidewalls of each of a gate electrode GEL and a gate metal layer 130, but the disclosure is not limited thereto. The gate insulating layer 162 may include a silicon compound or a metal oxide. For example, the gate insulating layer 162 may include silicon oxide, silicon nitride, silicon oxynitride, aluminum oxide, tantalum oxide, hafnium oxide, zirconium oxide, or titanium oxide. In an example, the gate insulating layer 162 may include a $SiO_x$ layer, but the disclosure is not limited thereto. In an example, the gate insulating layer 162 may include a double layer of $SiO_x/SiN_x$.

The gate conductive layer GCL may be disposed on the gate insulating layer 162. The gate conductive layer GCL may include the gate electrode GEL in the transistor region TRR and a first electrode CEL1 (or a lower electrode) of a capacitor in the capacitor region CPR. The gate conductive layer GCL may include the scan lines SCL and the sensing signal lines SSL of FIG. 3. The gate conductive layer GCL may not overlap the data conductive layer DCL in the pad area PDA, which will be described below.

The gate conductive layer GCL may be formed as a single layer or as a multilayer. In an embodiment, the gate conductive layer GCL may further include a gate main metal layer 130a and a gate base layer 130b, which is disposed below the gate main metal layer 130a. The gate main metal layer 130a and the gate base layer 130b may both be formed of a conductive material. No insulating layers may be interposed between the layers of the gate conductive layer GCL that overlap one another in the thickness direction. The gate main metal layer 130a and the gate base layer 130b may be etched and patterned together by a single mask process.

The gate base layer 130b may be disposed below the gate main metal layer 130a. The gate base layer 130b may improve the properties of forming a layer such as the adhesion of the gate main metal layer 130a or may prevent a reactive material from the gate insulating layer 162 from penetrating into the gate main metal layer 130a. The gate base layer 130b may also prevent the material of the gate main metal layer 130a (e.g., Cu) from diffusing into neighboring lower layers. The gate base layer 130b may include a material such as Ti, tantalum (Ta), Ca, Cr, Mg, or Ni, but the disclosure is not limited thereto.

The gate main metal layer 130a may mainly transmit signals and may be formed of a low-resistance material. The gate main metal layer 130a may be thicker than the gate base layer 130b and may be formed of a material having a lower resistance than the gate base layer 130b. The gate main metal layer 130a may include a material such as Cu, molybdenum (Mo), Al, or Ag, but the disclosure is not limited thereto.

Although not specifically illustrated, the gate metal layer 130 may further include a gate capping layer, which is disposed on the gate main metal layer 130a. The gate capping layer may cover (or overlap) and protect the gate main metal layer 130a from above the gate main metal layer 130a. The gate capping layer may directly contact the gate main metal layer 130a, but the disclosure is not limited thereto. The gate capping layer may be thinner than the gate main metal layer 130a and may be formed of a material having a higher resistance than the gate main metal layer 130a. The gate capping layer may protect the gate main metal layer 130a from etchants or other chemicals that are used during the fabrication of layers above the gate conductive layer GCL or the display device 1. The gate capping layer may prevent the material of the gate main metal layer 130a (e.g., Cu) from diffusing into neighboring upper layers.

The interlayer insulating layer 163 may be disposed on the gate conductive layer GCL. The interlayer insulating layer 163 may be disposed on the gate conductive layer GCL, portions of the semiconductor layer 150 exposed by the gate conductive layer GCL, and portions of the buffer layer 161 exposed by the gate conductive layer GCL and the semiconductor layer 160. The interlayer insulating layer 163 may include an inorganic insulating material such as silicon oxide, silicon nitride, silicon oxynitride, hafnium oxide, aluminum oxide, titanium oxide, tantalum oxide, or zinc oxide. In an example, the interlayer insulating layer 163 may include SiON.

For convenience, FIG. 5 illustrates that the interlayer insulating layer 163, which is formed of an inorganic material, has a flat top surface in the display area DPA, but the interlayer insulating layer 163 may have a surface shape that reflects any underlying height differences. The thicknesses of portions of the interlayer insulating layer 163 may be compared with respect to a same flat reference surface (e.g., the top surface of the buffer layer 161) with no height differences thereon.

The data conductive layer DCL may be disposed on the interlayer insulating layer 163. The data conductive layer DCL may include the source electrode SEL and a drain electrode DEL in the transistor region TRR, a second electrode CEL2 (or an upper electrode) of the capacitor in the capacitor region CPR, and the wire pad WPD in the pad area PDA.

The source electrode SEL and the drain electrode DEL may be electrically connected to the semiconductor layer 150 through second contact holes CNT2, which penetrate the interlayer insulating layer 163. The source electrode SEL may be electrically connected to the lower metal layer 120 through the first contact hole CNT1 that penetrates the interlayer insulating layer 163 and the buffer layer 161. The data conductive layer DCL may further include the data lines DTL, the reference voltage lines RVL, and the first power supply line ELVDL of FIG. 3.

Referring to FIGS. 5 and 6, the data conductive layer DCL may include a data conductive metal layer 141, a first data capping layer 142, which is disposed on the data conductive metal layer 141, a second data capping layer 143, which is disposed on the first data capping layer 142, and a third data capping layer 144, which is disposed on the second data capping layer 143.

The data conductive metal layer 141 may be formed as a single layer or as a multilayer. In an example, the data conductive metal layer 141 may include a data main metal layer 141a and a data base layer 141b, which is disposed below the data main metal layer 141a.

The data base layer 141b, the data main metal layer 141a, the first data capping layer 142, the second data capping layer 143, and the third data capping layer 144 may all be formed of a conductive material. No insulating layers may be interposed between the layers of the data conductive layer DCL. The data base layer 141b, the data main metal layer 141a, the first data capping layer 142, the second data capping layer 143, and the third data capping layer 144 may all be etched and patterned together by a single mask process. A process of forming a stacked structure of the data conductive layer DCL will be described below.

Similar to the gate base layer 130b, the data base layer 141b may improve the properties of forming a layer such as the adhesion of the data main metal layer 141a or may prevent a reactive material from the interlayer insulating layer 163 from penetrating into the data main metal layer 141a. The data base layer 141b may include at least one selected from among Ti, Ta, Ca, Cr, Mg, or Ni, but the disclosure is not limited thereto. In an example, the data base layer 141b may be formed of Ti.

The data main metal layer 141a may mainly transmit signals and may be formed of a low-resistance material. The data main metal layer 141a may be thicker than the data base layer 141b and the first, second, and third data capping layers 142, 143, and 144. The data main metal layer 141a may be formed of a material having a lower resistance than the first data capping layer 142, which is disposed directly on the data main metal layer 141a, and the data base layer 141b, which is disposed directly below the data main metal layer 141a. The data main metal layer 141a may include at least one selected from among Cu, Al, Ag, and Mo, but the disclosure is not limited thereto. In an example, the data main metal layer 141a may be formed of Cu.

The first data capping layer 142 may cover (or overlap) and protect the data main metal layer 141a, from above the data main metal layer 141a. The first data capping layer 142 may protect the data main metal layer 141a from etchants or other chemicals that are used during each fabrication process that follows the formation of the data conductive layer DCL (e.g., during the formation of the pixel electrode PXE), even if the second data capping layer 143 is exposed and etched away by such etchants or chemicals. The first data capping layer 142 may prevent the material of the data main metal layer 141a (e.g., Cu) from diffusing into neighboring upper layers. The first data capping layer 142 may directly contact the data main metal layer 141a.

The first data capping layer 142 may include Ti, zinc indium oxide (ZIO), or IZO. In an example, the first data capping layer 142 may be formed as a single layer or a multilayer including at least one of a Ti layer, a ZIO layer, and an IZO layer. In an embodiment, the first data capping layer 142 may be formed as, for example, a Ti single layer.

The second data capping layer 143 may be disposed on the first data capping layer 142. The second data capping layer 143 may protect the first data capping layer 142 from dry etching that may be performed during each fabrication process that follows the formation of the data conductive layer DCL (e.g., during the formation of a third contact hole CNT3 and a pad opening PDOP). The second data capping layer 142 may prevent the first data capping layer 142 from being unduly etched by such dry etching and may thus reduce the thickness of the first data capping layer 142.

The second data capping layer 143 may include a material that is not consumed by dry etching. The second data capping layer 143 may include ITO or IZO. The second data capping layer 143 may be formed as, for example, a single layer or a multilayer including at least one of an ITO layer and an IZO layer, but the disclosure is not limited thereto. In an example, the second data capping layer 143 may be formed as a single ITO layer.

The third data capping layer 144 may be disposed on the second data capping layer 143. The third data capping layer 144 may include a material having a higher etch rate than the first and second data capping layers 142 and 143 for the same etchant. In an example, the third data capping layer 144 may include a material having a twice higher etch rate than the first and second data capping layers 142 and 143 for the same etchant. In case that the first data capping layer 142 includes Ti and the second data capping layer 143 includes ITO, the third data capping layer 144 may include Cu or ZIO.

In case that the third data capping layer 144 includes a material having a higher etch rate than the first and second data capping layers 142 and 143 for a same etchant, the third data capping layer 144 may prevent formation of tips, which are protrusions of the first and second data capping layers 142 and 143 protruding further outward than the top surface of the data main metal layer 141a, during the formation of the data conductive layer DCL. This will be described below in detail.

Any tips of the first and second data capping layers 142 and 143, which are disposed on the data main metal layer 141a, may cause cracks due to a step coverage defect during the deposition of the passivation layer 164 that will be described below. For example, the third data capping layer 144, which includes a material having a higher etch rate than the first and second data capping layers 142 and 143 for a same etchant, may have a different etch rate from the materials of the layers of the data conductive layer DCL and may prevent the formation of tips on the top surface of the data main metal layer 141a during the formation of conductive patterns of the data conductive layer DCL. Therefore, the reliability of the circuit layer CCL may be improved.

As the formation of tips of the first and second data capping layers 142 and 143 is prevented, the pattern profile of the data conductive layer DCL may be improved, and the taper angle of the data conductive layer DCL may be reduced, so that the step coverage of layers (e.g., the passivation layer 164) to be formed may be improved.

As the third data capping layer 144, which includes a material having a twice higher etch rate than the first and second data capping layers 142 and 143 for a same etchant, is used, the content of fluorine (F) in an etchant may not need to be increased to raise an etch rate. Therefore, damage that may be caused by the diffusion of F to the interlayer insulating layer 163 may be reduced.

In an example, the data conductive layer DCL may include a data base layer 141b containing Ti, a data main metal layer 141a containing Cu, a first data capping layer 142 containing Ti, a second data capping layer 143 containing ITO, and a third data capping layer 144 containing Cu. For example, the data conductive layer DCL may include a quintuple layer of Ti/Cu/Ti/ITO/Cu. Sides (or sidewalls) of the data base layer 141b, sides (or sidewalls) of the data main metal layer 141a, sides (or sidewalls) of the first data capping layer 142, sides (or sidewalls) of the second data capping layer 143, and sides (or sidewalls) of the third data capping layer 144 may be aligned with one another. For example, in the data conductive layer DCL, the surfaces of each pair of adjacent element layers that are in contact with each other may be aligned without protruding from each other. In an embodiment, the third data capping layer 144 may be formed of ZIO, and the data conductive layer DCL may have a stacked structure of Ti/Cu/Ti/ITO/ZIO.

Referring to FIG. 6, the data main metal layer 141a, the data base layer 141b, the first data capping layer 142, the second data capping layer 143, and the third data capping layer 144 may have different thicknesses. Thicknesses T1, T2, T3, T4, and T5 of the data main metal layer 141a, the data base layer 141b, the first data capping layer 142, the second data capping layer 143, and the third data capping layer 144 may be defined as the distances from bottom surfaces of the data main metal layer 141a, the data base layer 141b, the first data capping layer 142, the second data capping layer 143, and the third data capping layer 144 to the top surfaces of the data main metal layer 141a, the data base layer 141b, the first data capping layer 142, the second data capping layer 143, and the third data capping layer 144, respectively.

In an example, the thickness T1 of the data main metal layer 141a may be greater than the thicknesses T2 of the data base layer 141b, the thickness T3 of the first data capping layer 142, the thickness T4 of the second data capping layer 143, and the thickness T5 of the third data capping layer 144. The data base layer 141b and the first data capping layer 142, which directly contact the data main metal layer 141a from above and below the data main metal layer 141a and protect the data main metal layer 141a, may be sufficiently thick. The third data capping layer 144, which does not directly contact the data main metal layer 141a, may not need to be as thick as the data base layer 141b, the first data capping layer 142, or the second data capping layer 143.

In an example, in case that the data conductive layer DCL is a quintuple layer of Ti/Cu/Ti/ITO/Cu, the data main metal layer 141a may have a thickness T1 of about 5,000 Å to about 20,000 Å, the data base layer 141b may have a thickness T2 of about 100 Å to about 300 Å, the first data capping layer 142 may have a thickness T3 of about 100 Å to about 500 Å, and the second data capping layer 143 may have a thickness T4 of about 100 Å to about 500 Å, a thickness T5 of the third data capping layer 144 may be about 100 Å or less. In an embodiment, a thickness T5 of the third data capping layer 144 may be about 10 Å to about 100 Å. The viscosity of an etchant for use in an etching process for forming a pixel electrode material layer (or pixel electrode layer) may be high. If a thickness T5 of the third data capping layer 144, which is exposed by the pad opening PDOP, is about 100 Å or less, the penetration of an etchant into the interface between the third data capping layer 144 and the passivation layer 164 may be prevented, and thus, the third data capping layer 144 and the passivation layer 164 may be prevented from being lifted off of each other.

Referring again to FIG. 5, the data conductive layer DCL may include a first area 140A, a second area 140B, and a third area 140C along the structure of the third data capping layer 144, which is disposed at the uppermost layer of the data conductive layer DCL, and/or along the layer contacting the top surface of the third data capping layer 144.

The third data capping layer 144 of the data conductive layer DCL may have different structures, or a layer of the data conductive layer DCL contacting a top surface of the third data capping layer 144 may be different. The first, second, and third areas 140A, 140b, and 140C of the data conductive layer DCL will be described below.

The passivation layer 164 may be disposed on the data conductive layer DCL. The passivation layer 164 may cover and protect the data conductive layer DCL. The passivation layer 164 may include an inorganic insulating material such as silicon oxide, silicon nitride, silicon oxynitride, hafnium oxide, aluminum oxide, titanium oxide, tantalum oxide, or zinc oxide.

The passivation layer 164 may be formed in the entire display area DPA and may not be formed in at least a portion of the non-display area NDA. The passivation layer 164 may not be disposed in at least a portion of the third area 140C (or on at least a portion of the wire pad WPD) of the data conductive layer DCL in the pad area PDA, which is included in the non-display area NDA.

A via layer 165 may be disposed on the passivation layer 164. The via layer 165 may cover the top surface of the passivation layer 164 and may expose side surfaces of end portions of the passivation layer 164 in the pad area PDA.

The via layer 165 may include the pad opening PDOP, which exposes at least a portion of the third area 140C of the data conductive layer DCL in the pad area PDA. The via layer 165, which forms the inner sidewalls of the pad opening PDOP, may expose the side surfaces of the end portions of the passivation layer 164 in the pad area PDA, but the disclosure is not limited thereto. For example, the pad opening PDOP may be formed by portions of the passivation layer 164 and the via layer 165 in the pad area PDA, and inner sidewalls of the portion of the passivation layer 164 may be aligned with inner sidewalls of the portion of the via layer 165. The via layer 165 may cover the side surfaces of the end portions of the passivation layer 164 in the pad area PDA to form the inner sidewalls of the pad opening PDOP.

The via layer 165 may include an organic insulating material such as an acrylic resin, an epoxy resin, a phenolic resin, a polyamide resin, a polyimide resin, an unsaturated polyester resin, a polyphenylene resin, a polyphenylene sulfide resin, or BCB. The via layer 165 may further include a photosensitive material, but the disclosure is not limited thereto. In an example, the via layer 165 may include polyimide.

The pixel electrode PXE may be disposed on the via layer 165. The material of the pixel electrode PXE is as described above with reference to FIG. 2. In an example, the pixel electrode PXE may include a triple layer of ITO/Ag/ITO.

The pixel electrode PXE may be disposed in the display area DPA, but may not be disposed in the non-display area NDA. The pixel electrode PXE may overlap the transistor region TRR and the capacitor region CPR of the display area DPA, but the disclosure is not limited thereto. The pixel electrode PXE may be electrically connected to the source electrode SEL of the driving transistor DTR through the third contact hole CNT3 passing through the via layer 165 and the passivation layer 164.

The pixel-defining layer PDL may be disposed on the pixel electrode PXE. The material of the pixel-defining layer PDL is as described above with reference to FIG. 2. In an example, the pixel-defining layer PDL may include polyimide.

The pixel-defining layer PDL may be disposed in the display area DPA but may not be disposed in the non-display area NDA. The pixel-defining layer PDL may overlap the edges of the pixel electrode PXE. The pixel-defining layer PDL may be disposed even on portions of the via layer 165 where the pixel electrode PXE is not formed.

The first, second, and third areas 140A, 140B, and 140C of the data conductive layer DCL will hereinafter be described in detail.

The data conductive layer DCL may include the first area 140A, which overlaps the third contact hole CNT3, the second area 140B, which is generally covered by the passivation layer 164, and the third area 140C, which is exposed by the pad opening PDOP. The first and second areas 140A and 140B of the data conductive layer DCL may be disposed in the display area DPA, and the third area 140C of the data conductive layer DCL may be disposed in the non-display area NDA.

The first area 140A of the data conductive layer DCL may be disposed in the transistor region TRR. The source electrode SEL of the driving transistor DTR may be formed as the first area 140A of the data conductive layer DCL, which is disposed in the transistor region TRR. The second area 140B of the data conductive layer DCL may be disposed in the transistor region TRR and/or the capacitor region CPR of the display area DPA. The source and drain electrodes SEL and DEL of the driving transistor DTR or the second electrode CEL2 may be formed by the second area 140B of the data conductive layer DCL.

The third data capping layer 144 may cover the entire top surface of the second data capping layer 143 in the first and second areas 140A and 140B of the data conductive layer DCL disposed in the display area DPA. For example, portions of the second data capping layer 143 in the first and second areas 140A and 140B of the data conductive layer DCL may not be exposed by the third data capping layer 144.

The first area 140A of the data conductive layer DCL may be electrically connected to the pixel electrode PXE through the third contact hole CNT3. Specifically, the passivation layer 164 and the pixel electrode PXE may be disposed on the top surface of the third data capping layer 144, in the first area 140A of the data conductive layer DCL. At least a portion of the top surface of the third data capping layer 144 in the first area 140A of the data conductive layer DCL, which overlaps the third contact hole CNT3, may contact the pixel electrode PXE, and the rest of the top surface of the third data capping layer 144 in the first area 140A of the data conductive layer DCL may contact the passivation layer 164. The pixel electrode PXE may fill the third contact hole CNT3 and may contact and be electrically connected to the portion of the top surface of the third data capping layer 144 in the first area 140A of the data conductive layer DCL.

The passivation layer 164 may be disposed on the top surface of the second area 140B of the data conductive layer DCL. Specifically, the top surface of the third data capping layer 144 may contact the passivation layer 164 in the second area 140B of the data conductive layer DCL. The passivation layer 164 may be disposed on the entire top surface of the third data capping layer 144 in the second area 140B of the data conductive layer DCL to cover the entire second area 140B of the data conductive layer DCL.

The third area 140C of the data conductive layer DCL may be disposed in the pad area PDA. The wire pad WPD of the pad area PDA may be formed by the third area 140C of the data conductive layer DCL, which is disposed in the pad area PDA.

In the third area 140C of the data conductive layer DCL, which is disposed in the non-display area NDA, the third data capping layer 144 may not overlap at least a portion of the second data capping layer 143. Portions of the third data capping layer 144 in the third area 140C of the data conductive layer DCL will hereinafter be referred to as a pad conductive layer 145 to be distinguished from portions of the third data capping layer 144 in the first and second areas 140A and 140B.

The pad conductive layer 145 in the third area 140C of the data conductive layer DCL may at least partially expose the top surface of the portion of the second data capping layer 143 in the third area 140C of the data conductive layer DCL. The pad conductive layer 145 in the third area 140C of the data conductive layer DCL may not overlap the pad opening PDOP. Therefore, the top surface of the portion of the second data capping layer 143 in the third area 140C of the data conductive layer DCL may be exposed by the pad opening PDOP.

The pad conductive layer 145 in the third area 140C of the data conductive layer DCL may include inner side surfaces, which are disposed in the pad opening PDOP, and outer side surfaces, which are located opposite to the inner side surfaces. In an example, the inner side surfaces of the pad conductive layer 145 in the third area 140C of the data conductive layer DCL may be aligned with the inner sidewalls of the passivation layer 164 that form the pad opening PDOP, but the disclosure is not limited thereto. As another example, the inner side surfaces of the pad conductive layer 145 in the third area 140C of the data conductive layer DCL may not be aligned with the inner sidewalls of the passivation layer 164 that form the pad opening PDOP. As mentioned above, the outer side surfaces of the pad conductive layer 145 in the third area 140C of the data conductive layer DCL may be aligned with the side surfaces of the portions of the second data capping layer 143 below the pad conductive layer 145.

A method of fabricating the display device of FIG. 5 will hereinafter be described.

Figure 12:
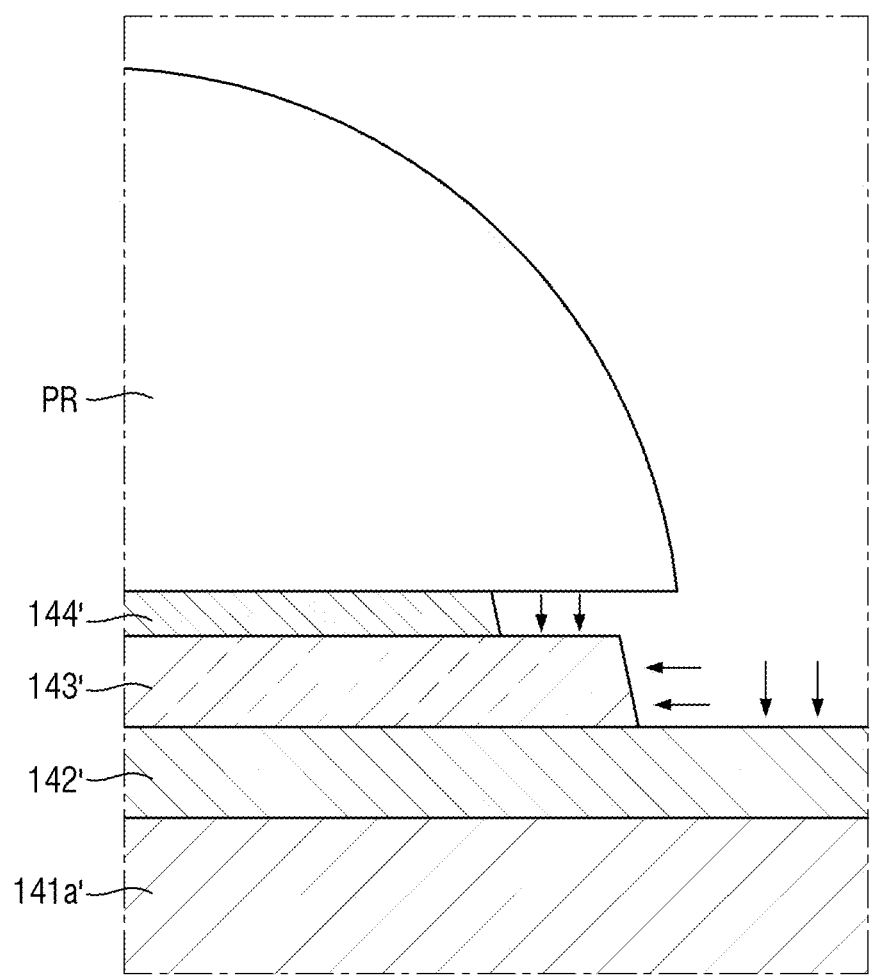
Figure 13:
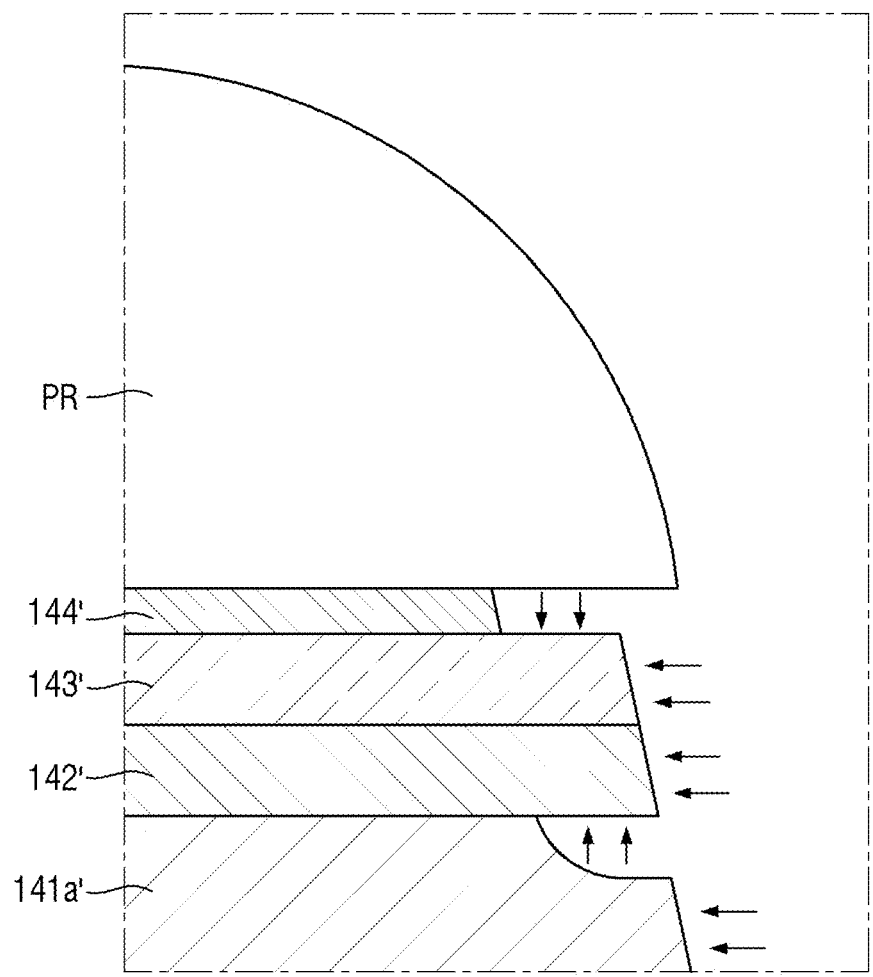
Figure 14:
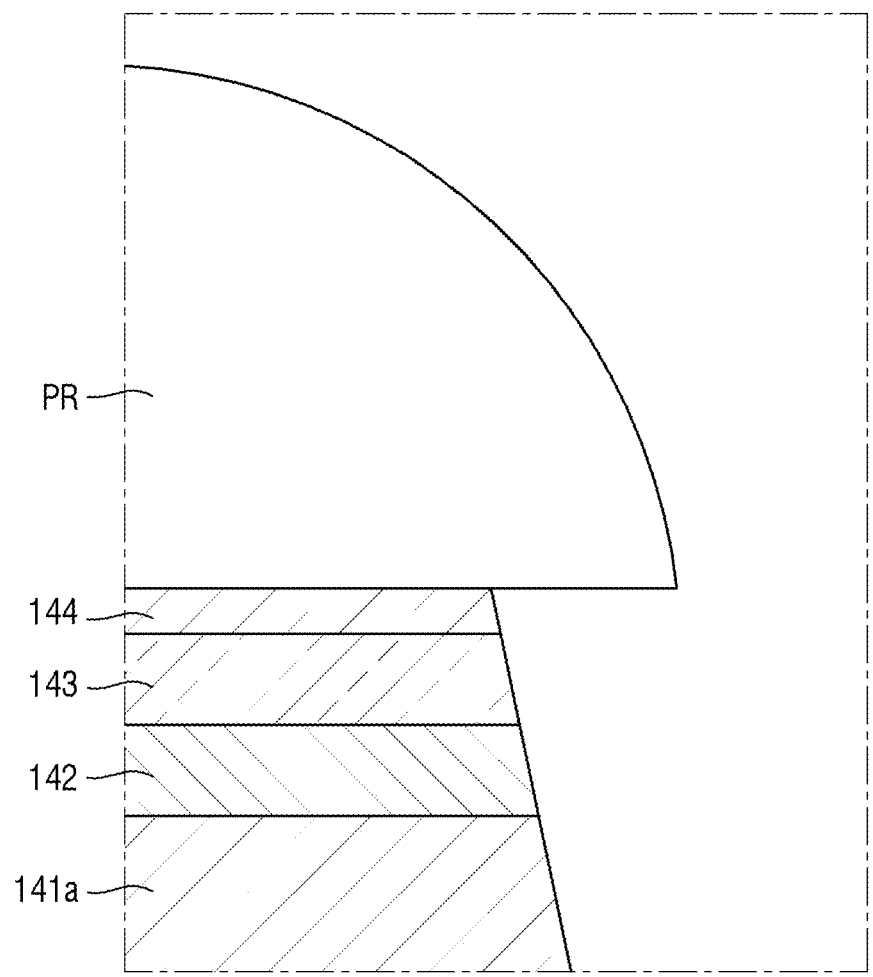

FIGS. 7 to 19 are schematic cross-sectional views illustrating how to fabricate the display device of FIG. 5. FIGS. 12 to 14 are schematic enlarged cross-sectional views of an area B of FIG. 11.

Figure 7:
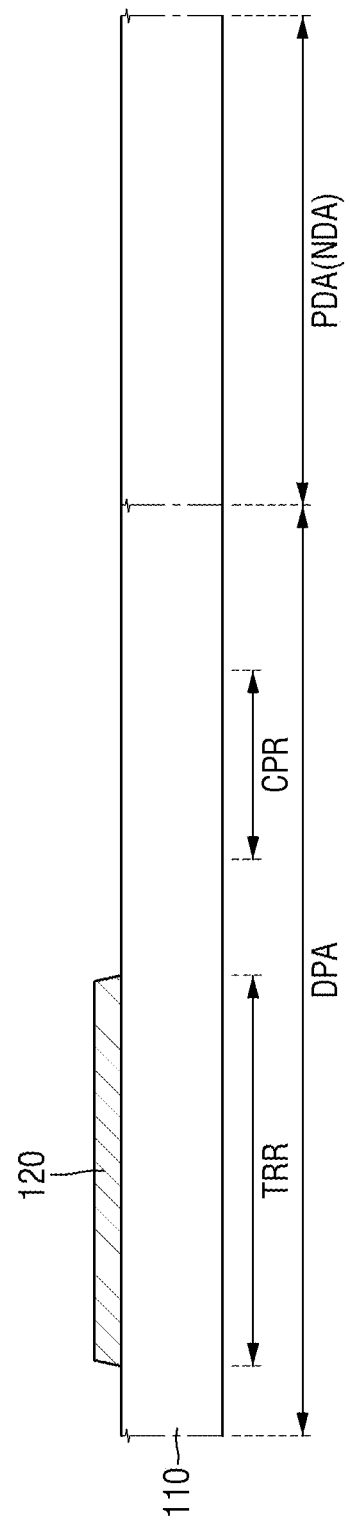
FIGS. 7 through 19 are schematic cross-sectional views illustrating how to fabricate the display device of FIG. 5.

Referring to FIG. 7, the lower metal layer 120, which is patterned, may be formed on the first substrate 110. The lower metal layer 120 may be formed by a mask process. In an example, the lower metal layer 120 may be formed by depositing a material layer for a lower metal layer on the entire surface of the first substrate 110 and patterning the material layer for the lower metal layer by photolithography to form the lower metal layer 120.

Figure 8:
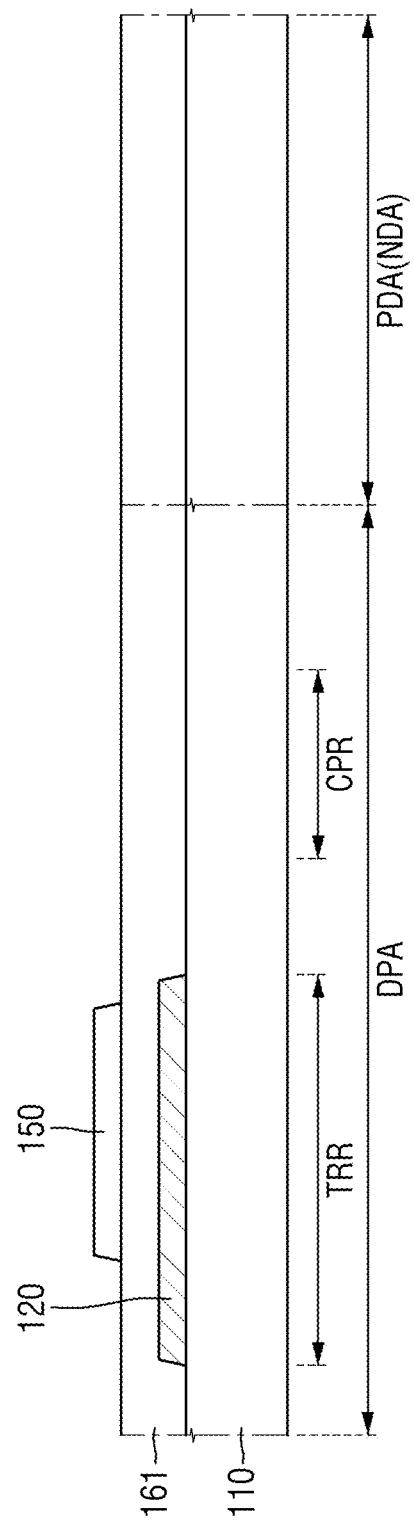

Referring to FIG. 8, the buffer layer 161 may be formed on the entire surface of the first substrate 110 with the lower metal layer 120 formed thereon. The semiconductor layer 150 may be formed on the buffer layer 161. The semiconductor layer 150 may be formed by a mask process. In an example, the semiconductor layer 150 may be formed by depositing an oxide semiconductor on the entire surface of the buffer layer 161 and patterning the oxide semiconductor by photolithography.

Figure 9:
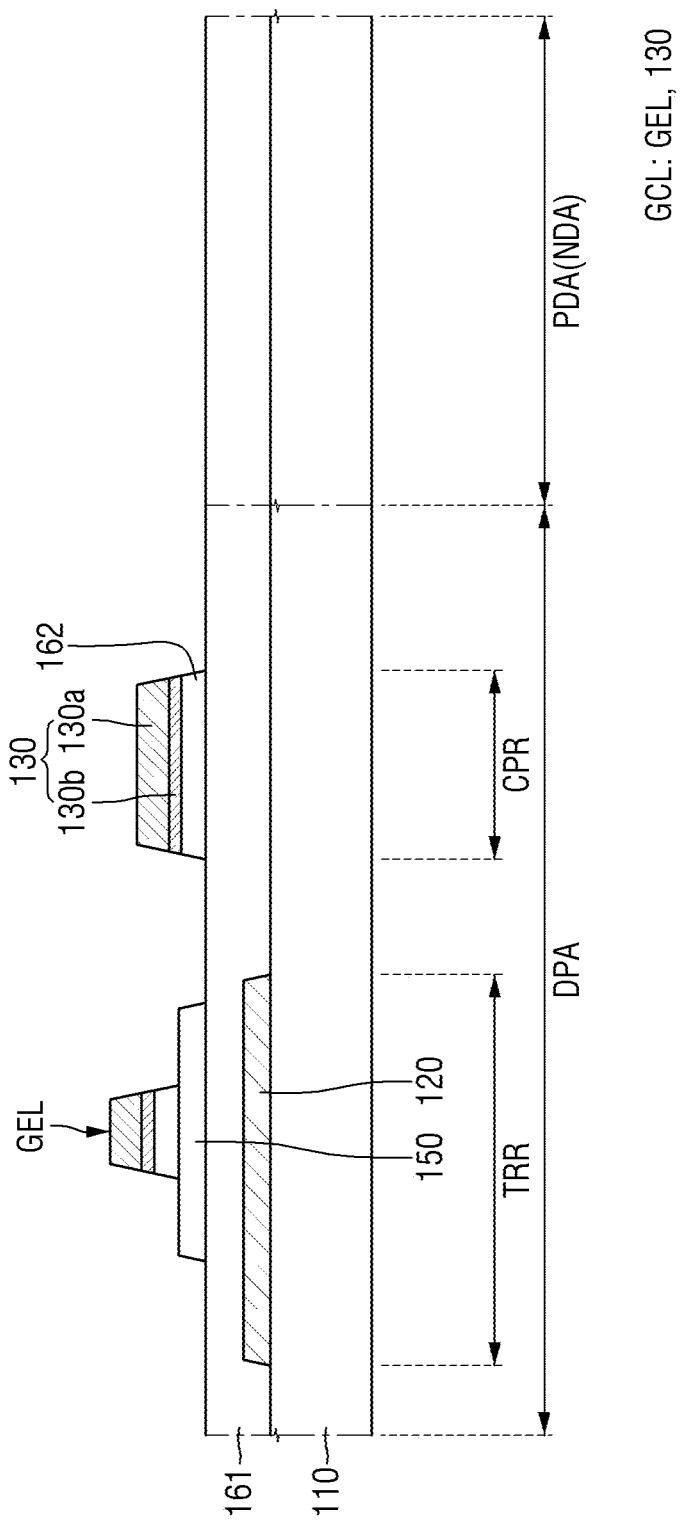

Referring to FIG. 9, the gate insulating layer 162 and the gate conductive layer GCL, which are patterned, may be formed on the buffer layer 161 with the semiconductor layer 150 formed thereon. The patterned gate insulating layer 162 and gate conductive layer GCL may be formed by a single mask process.

Specifically, a material layer for a gate insulating layer may be deposited on the entire surface of the buffer layer 161 with the semiconductor layer 150 formed thereon. A material layer for a gate base layer and a material layer for a gate main metal layer may be sequentially deposited on the material layer for the gate insulating layer. A photoresist pattern may be formed by applying a photoresist layer to the material layer for the gate main metal layer and subjecting the photoresist layer to exposure and development, and the material layer for the gate main metal layer, the material layer for the gate base layer, and the material layer for the gate insulating layer may be sequentially etched using the photoresist pattern as an etching mask. The gate conductive layer GCL, which includes the gate electrode GEL and the gate metal layer 130, may be formed by removing the photoresist pattern by stripping or ashing.

The photoresist pattern has been described above as being used as an etching mask until the gate insulating layer 162 is patterned, but each patterned upper layer may be used as a hard mask for etching lower layers disposed therebelow. The photoresist pattern may be used together with the hard mask as an etching mask. As another example, the photoresist pattern may be removed after the formation of a hard mask, and layers below the hard mask may be etched using the hard mask as an etching mask.

Figure 10:
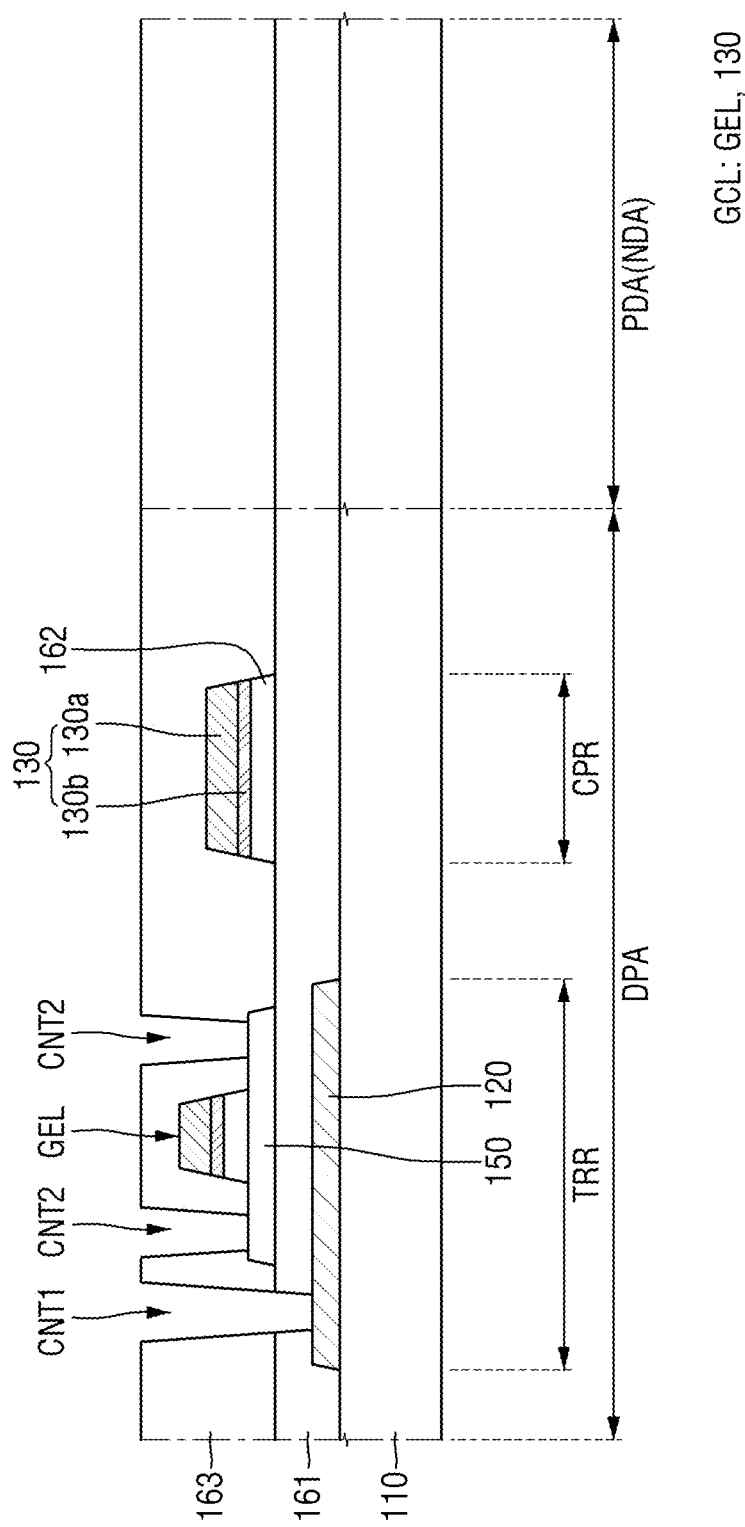

Referring to FIG. 10, the interlayer insulating layer 163 may be deposited on the buffer layer 161 with the gate conductive layer GCL formed thereon, and the first contact hole CNT1, which exposes a portion of the lower metal layer 120, and the second contact holes CNT2, which expose portions of the semiconductor layer 150 (for example, source and drain regions), may be formed. The first contact hole CNT1 and the second contact holes CNT2 may be formed by a mask process. The first contact hole CNT1 and the second contact holes CNT2 may be sequentially formed using different masks. For example, a layer for an interlayer insulating layer (or insulating film) may be deposited on the entire surface of the buffer layer 161 with the gate conductive layer GCL formed thereon. A first photoresist pattern may be formed on the layer for the interlayer insulating layer to expose a portion of the lower metal layer 120, and the first contact hole CNT1, which exposes a portion of the lower metal layer 210, may be formed by etching the layer for the interlayer insulating layer and the buffer layer 161 by using the first photoresist pattern as an etching mask. The first photoresist pattern may be removed, a second photoresist pattern to expose a portion of the semiconductor layer 150 may be formed on the layer for the interlayer insulating layer, and the second contact holes CNT2 may be formed by etching the layer for the interlayer insulating layer by using the second photoresist pattern as an etching mask.

The first contact hole CNT1 and the second contact holes CNT2 may be formed by a same mask. The semiconductor layer 150 may be exposed to an etchant during the etching of the buffer layer 161 to form the first contact hole CNT1. As mentioned above, if the first contact hole CNT1 is formed first and the second contact holes CNT2 are formed using a separate mask, damage to the surfaces of portions of the semiconductor layer 150 exposed by the second contact holes CNT2 may be suppressed.

Figure 11:
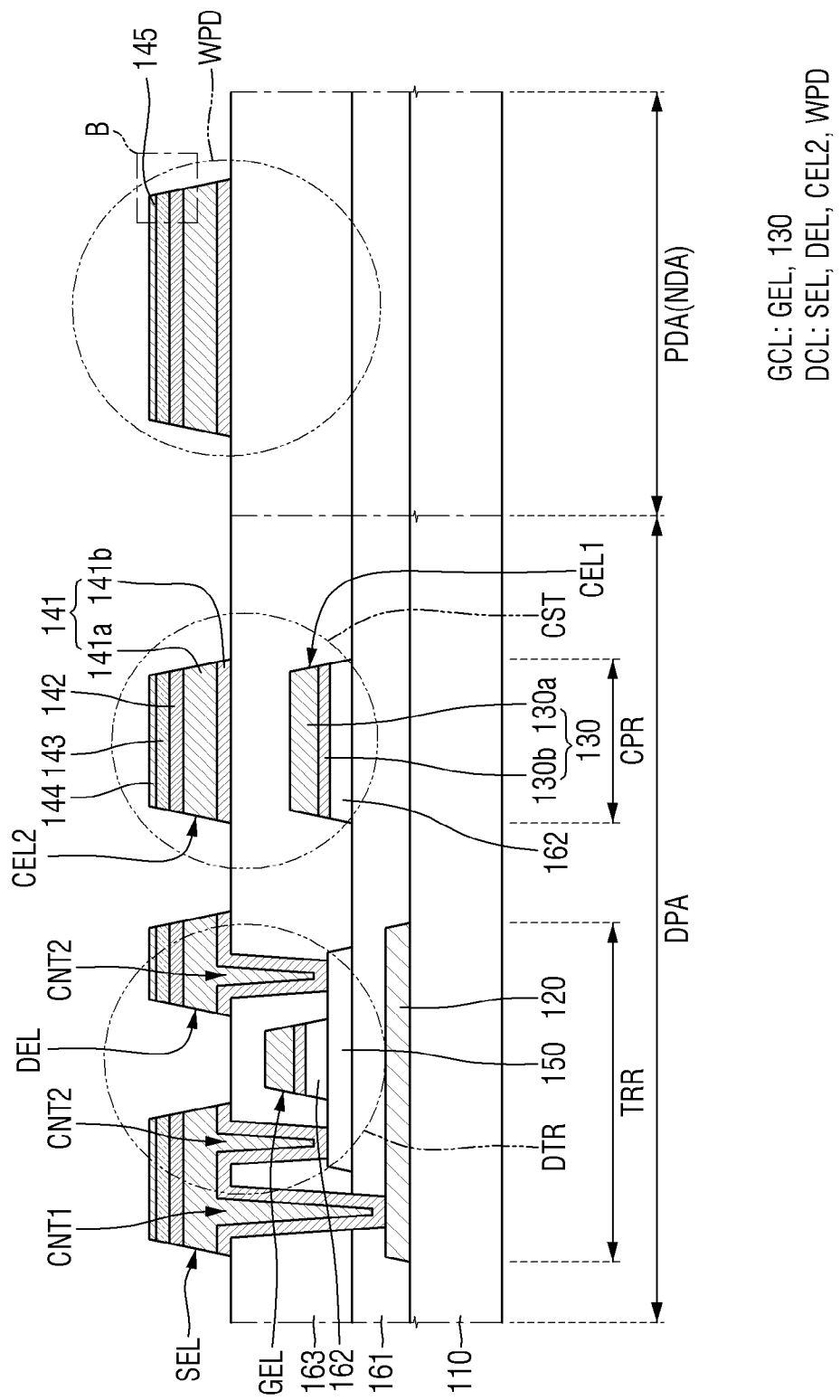

Referring to FIG. 11, the data conductive layer DCL, which is patterned, may be formed on the interlayer insulating layer 163. The data conductive layer DCL may be formed by a mask process. In an example, material layers for data conductive metal layer, a material layer for a first data capping layer, a material layer for a second data capping layer, and a material layer for a third data capping layer may be sequentially deposited each other on the entire surface of the interlayer insulating layer 163. The material layers for the data conductive metal layer may include a material layer for a data base layer and a material layer for a data main metal layer.

In an example, in case that the data conductive layer DCL is formed as a quintuple layer of Ti/Cu/Ti/ITO/Cu, a material layer for a data base layer containing Ti, a material layer for a data main metal layer containing Cu, a material layer for a first data capping layer containing Ti, a material layer for a second data capping layer containing ITO, and a material layer for a third data capping layer containing Cu may be formed by physical vapor deposition (PVD), for example, sputtering. In this process, the material layer for the data conductive metal layer, the material layer for the first data capping layer, the material layer for the second data capping layer, and/or the material layer for the third data capping layer may be deposited each other on the insides of the first contact hole CNT1 and the second contact holes CNT2 and may thus be electrically connected to the lower metal layer 120 and the semiconductor layer 150.

A photoresist pattern may be formed by applying a photoresist layer to the material layer for the third data capping layer and subjecting the photoresist layer to exposure and development, and the material layers for the first, second, and third data capping layers and the material layers for the data conductive metal layer may be etched using the photoresist pattern as an etching mask. The photoresist pattern may be removed by stripping or ashing, and the data conductive layer DCL, which includes the source and drain electrodes SEL and DEL in the transistor region TRR, the second electrode CEL2 in the capacitor region CPR, and the wire pad WPD in the pad area PDA, may be formed as illustrated in FIG. 11.

Referring to FIG. 11, the source and drain electrodes SEL and DEL in the transistor region TRR, the second electrode CEL2 in the capacitor region CPR, and the wire pad WPD in the pad area PDA may be formed in a structure where the data base layer 141b, the data main metal layer 141a, the first data capping layer 142, the second data capping layer 143, and the third data capping layer 144 are sequentially stacked. The sidewalls of the data base layer 141*b*, the sidewalls of the data main metal layer 141*a*, the sidewalls of the first data capping layer 142, the sidewalls of the second data capping layer 143, and the sidewalls of the third data capping layer 144 may be aligned with one another.

In an example, the third data capping layer 144 may be formed of a material having a twice higher etch rate than the first and second data capping layers 142 and 143 for a same etchant, and thus the formation of tips of the first and second data capping layers 142 and 143 may be prevented. The etching of the data conductive layer DCL will hereinafter be described in detail with reference to FIGS. 12 to 14.

Referring to FIG. 12, a photoresist pattern PR may be formed on a material layer 144' for a third data capping layer, and the material layer 144' for the third data capping layer may be etched using an etchant and using the photoresist pattern PR as an etching mask. The material layer 144' for the third data capping layer may be etched first, and a material layer 143' for a second data capping layer, a material layer 142' for a first data capping layer, and a material layer 141*a*' for a data main metal layer that are exposed by the etched material layer 144' for the third data capping layer may be sequentially etched. Although not illustrated in the drawings, a material layer for a data baes layer may also be etched.

As the third data capping layer 144 is formed of a material having a higher etch rate than the first and second data capping layers 142 and 143 for a same etchant, sidewalls of the material layer 144' for the third data capping layer may be inwardly etched quickly. A material layer 143' for the second data capping layer and the material layer 142' for the first data capping layer may be sequentially etched. If the sidewalls of the material layer 144' for the third data capping layer are inwardly etched quickly, the top surface and the sidewalls of the material layer 143' for the second data capping layer, which is disposed below the material layer 144' for the third data capping layer, may be exposed by the etchant. Because the top surface and the sidewalls of the material layer 143' for the second data capping layer are both etched, the material layer 143' for the second data capping layer may be etched more quickly than when only the sidewalls of the material layer 143' for the second data capping layer are etched.

Referring to FIG. 13, as the material layer 143' for the second data capping layer and the material layer 142' for the first data capping layer have similar etch rates for the same etchant, the material layer 143' for the second data capping layer and the material layer 142' for the first data capping layer may be etched at similar speeds with their sidewalls aligned with one another. As a material layer 141*a*' for a data main metal layer, which is disposed below the material layer 142' for the first data capping layer, is etched quickly because of being formed of the same material and having the same etch rate for the same etchant as the material layer 144' for the third data capping layer, the bottom surface of the material layer 142' for the first data capping layer may be exposed and etched by the etchant.

As the top surface of the material layer 143' for the second data capping layer, the side surfaces of the material layer 143' for the second data capping layer and the material layer 142' for the first data capping layer, and the bottom surface of the layer 142' for the first data capping layer are etched at the same time, the material layer 143' for the second data capping layer and the material layer 142' for the first data capping layer may be etched quickly.

As illustrated in FIG. 14, the sidewalls of the first data capping layer 142 and the sidewalls of the second data capping layer 143 may be aligned with the sidewalls of the data main metal layer 141*a*, and thus the formation of tips may be prevented.

As mentioned above, even in case that the material layer 141*a*' for the data main metal layer includes Cu, the material layer 142' for the first data capping layer includes Ti having a lower etch rate than Cu for a same etchant, and the material layer 143' for the second data capping layer includes ITO having a lower etch rate than Cu for a same etchant, the sidewalls of the data conductive layer DCL may be etched to be aligned with one another if the material layer 144' for the third data capping layer includes a material (e.g., Cu) having a higher etch rate than the materials (e.g., Ti and ITO) of the first and second data capping layer material layers 142' and 143' for the same etchant. Therefore, as the material layer 144' for the third data capping layer includes a material having a higher etch rate than the material layers 142' and 143' for the first and second data capping layers for the same etchant, the formation of tips of the first and second data capping layers 142 and 143 that may be caused by differences in etch rate between the materials of the layers of the data conductive layer DCL may be prevented.

Figure 15:
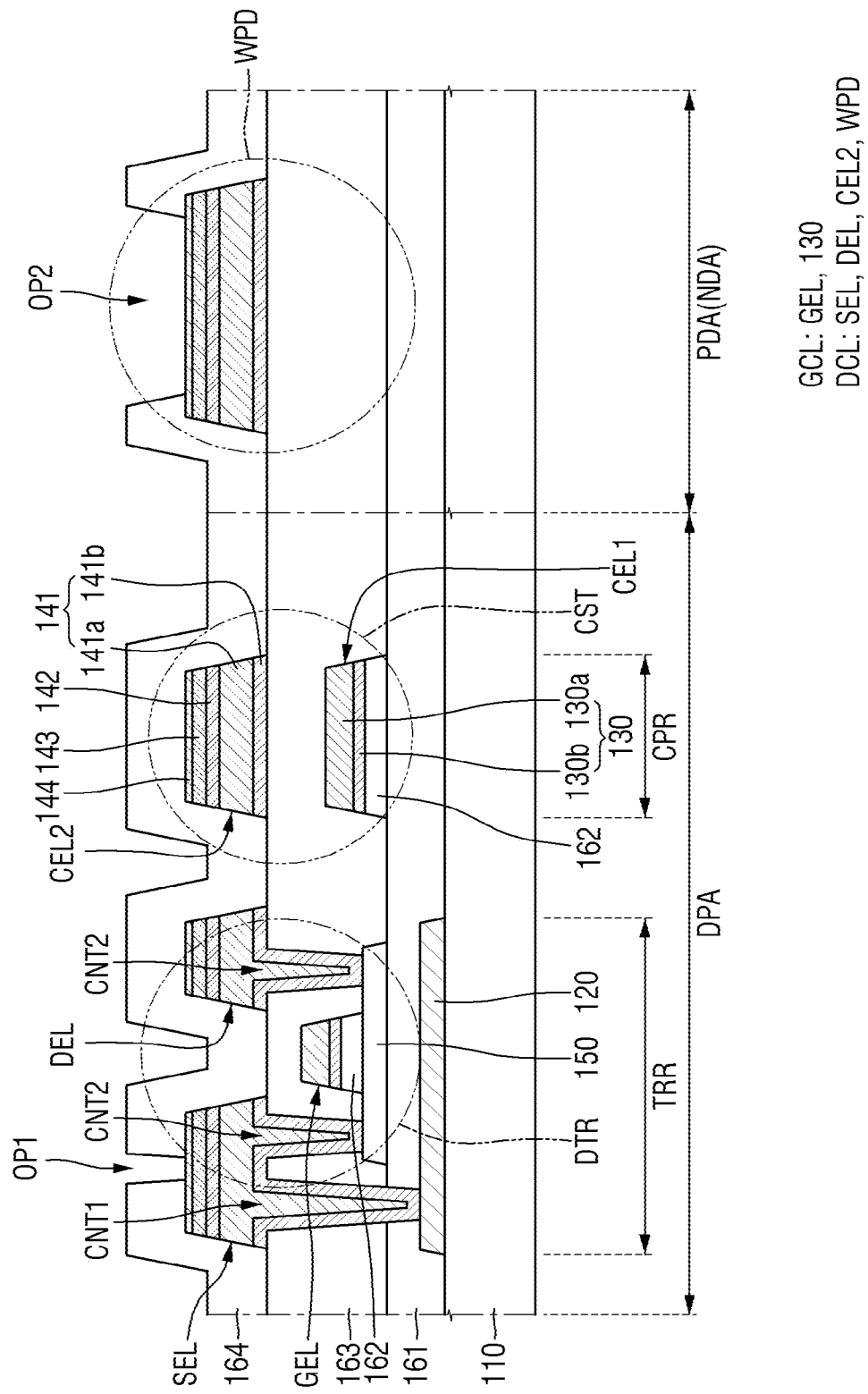

Referring to FIG. 15, the passivation layer 164 may be formed on the interlayer insulating layer 163 with the data conductive layer DCL formed thereon, and a photoresist pattern may be formed on the passivation layer 164.

Specifically, a material layer for the passivation layer may be deposited on the entire surface of the interlayer insulating layer 163 with the data conductive layer DCL formed thereon. A photoresist pattern may be formed by forming a photoresist layer on the material layer for the passivation layer and subjecting the photoresist layer to exposure and development. The photoresist pattern may include a first opening OP1, which exposes an area that overlaps the source electrode SEL in the transistor region TRR, and a second opening OP2, which exposes an area that overlaps the wire pad WPD in the pad area PDA. In an example, the width of the first opening OP1 may be less than or equal to that of the source electrode SEL, and the width of the second opening OP2 may be less than or equal to that of the wire pad WPD in the pad area PDA. However, the disclosure is not limited to this example.

The material layer for the passivation layer may be etched using the photoresist pattern as an etching mask. A portion of the material layer for the passivation layer exposed by the first opening OP1 may be etched so that a contact hole is formed to expose the source electrode SEL in the transistor region TRR. A portion of the material layer for the passivation layer exposed by the second opening OP2 may be removed so that a portion of the third data capping layer 144 in the uppermost layer of the wire pad WPD is exposed. For example, the passivation layer 164 may not be disposed on at least a portion of the wire pad WPD in the pad area PDA, and at least a portion of the wire pad WPD in the pad area PDA may not overlap the passivation layer 164 in the thickness direction.

Figure 16:
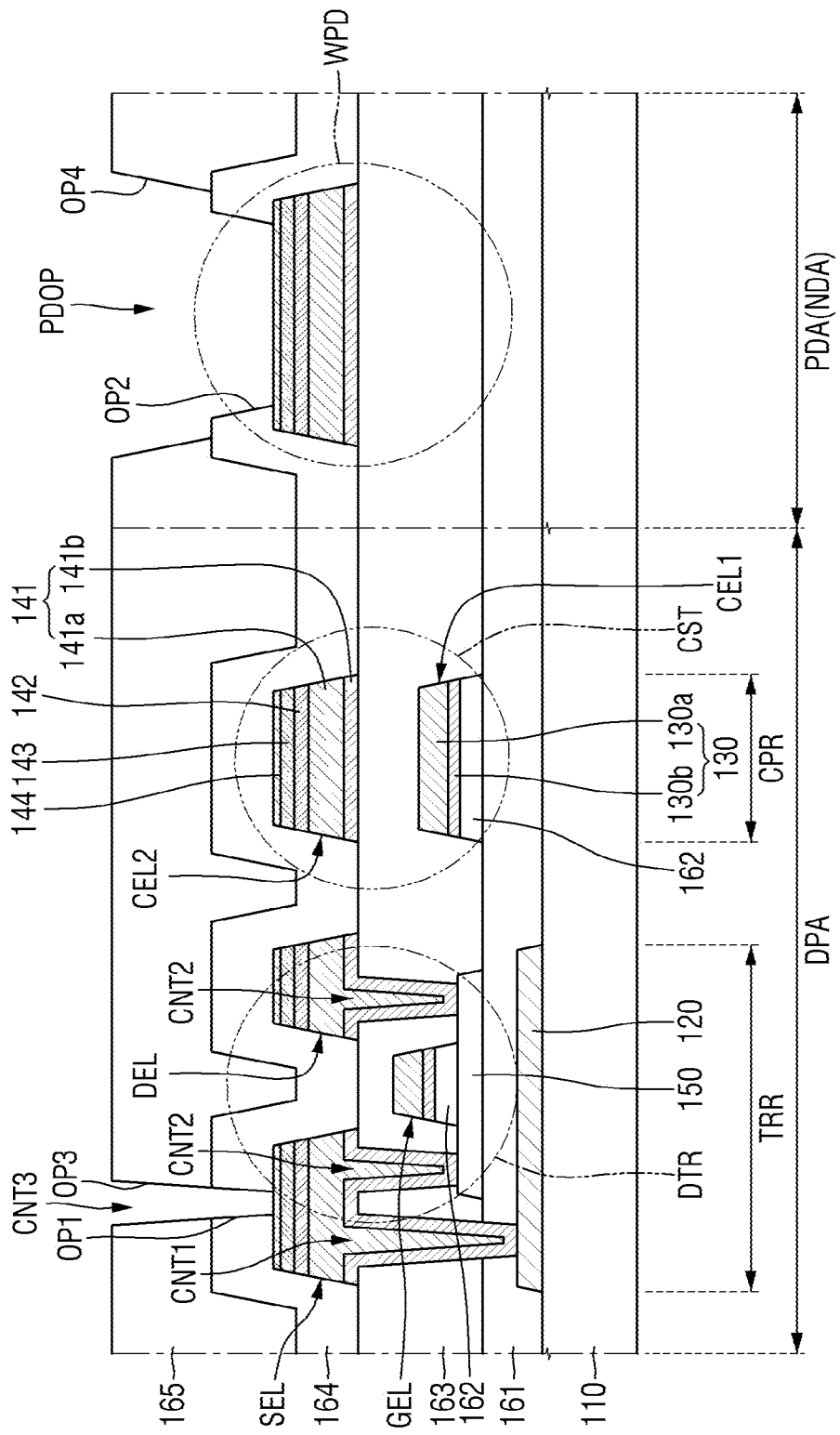

Referring to FIG. 16, the via layer 165, which is patterned, may be formed on the passivation layer 164. The patterned via layer 165 may include a third opening OP3, which exposes the first opening OP1 formed in the passivation layer 164, and a fourth opening OP4, which exposes at least a portion of the wire pad WPD in the pad area PDA. The third opening OP3 may form the third contact hole CNT3 together with the first opening OP1, which exposes the source electrode SEL. The fourth opening OP4 may form the pad opening PDOP.

In an example, the width of the third opening OP3 may be greater than that of the first opening OP1, and the width of the fourth opening OP4 may be greater than that of the second opening OP2, which is formed by the process described above with reference to FIG. 15. Thus, in the pad area PDA, the via layer 165 may cover or overlap at least a portion of the top surface of the passivation layer 164 in the pad area PDA. The via layer 165 may expose the side surfaces of the end portions of the passivation layer 164 in the pad area PDA.

The via layer 165 may include, for example, an organic material that includes a photosensitive material. The via layer 165 may be formed by applying an organic material layer for a via layer and subjecting the organic material layer for the via layer to exposure and development to form the third and fourth openings OP3 and OP4. Although not specifically illustrated, the via layer 165 may have different heights in different areas and may be formed using a halftone mask or a slit mask.

Figure 17:
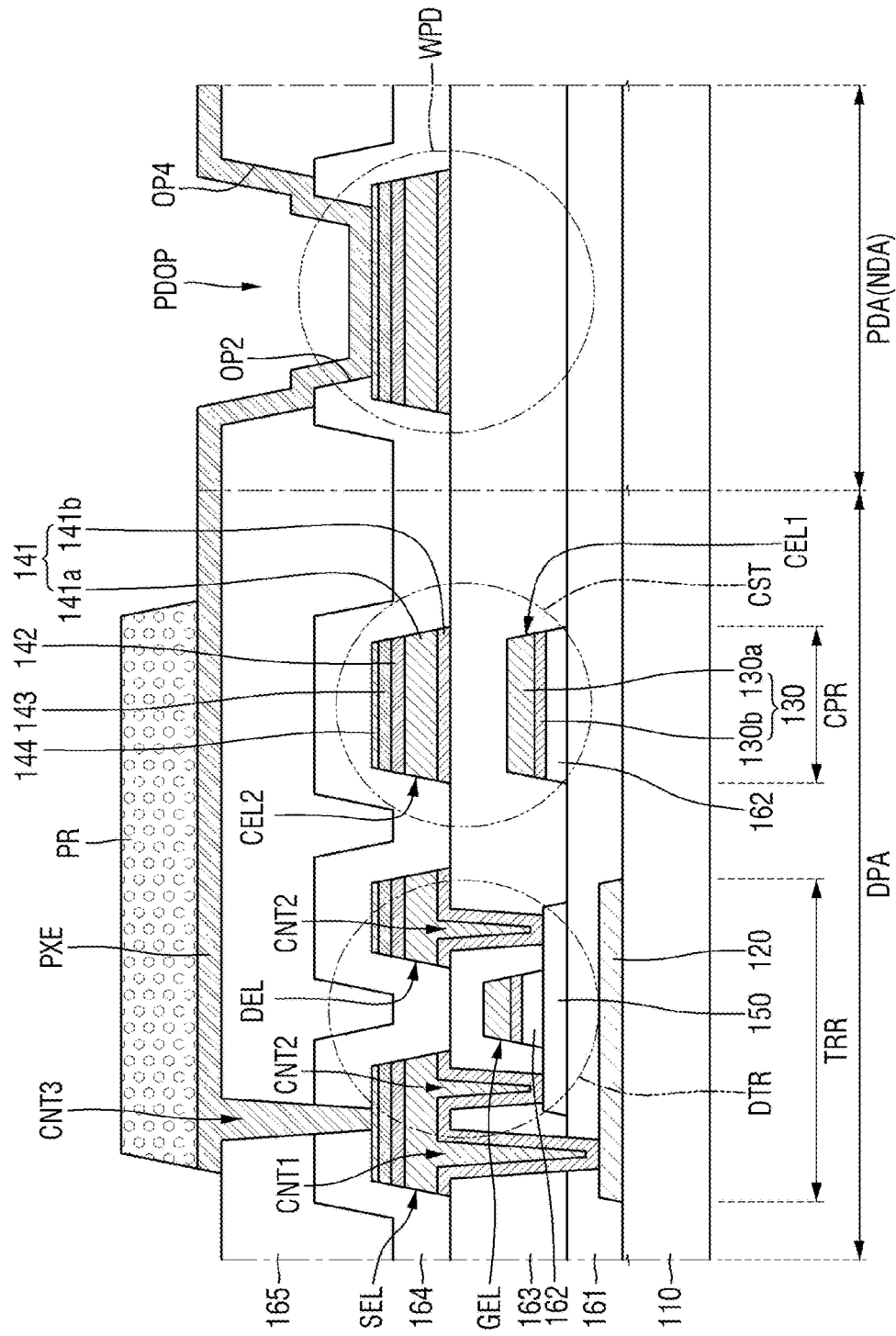
Figure 18:
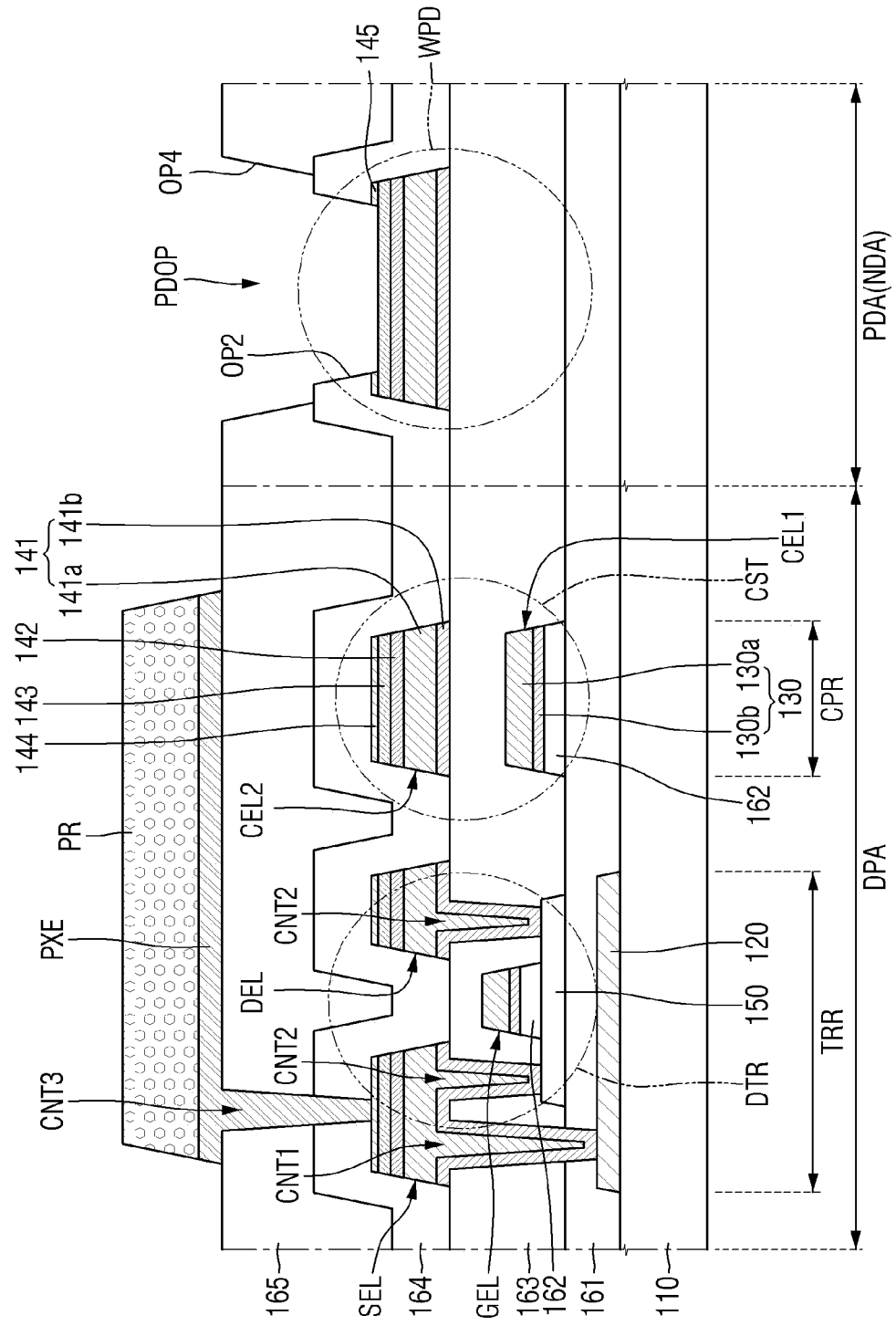

Referring to FIGS. 17 and 18, the pixel electrode PXE, which is patterned, may be formed on the via layer 165. The pixel electrode PXE may be formed by a mask process.

Referring to FIG. 17, a pixel electrode material layer (or pixel electrode layer) may be deposited on the entire surface of the via layer 165. The pixel electrode material layer may be deposited even on the inside of the third contact hole CNT3 to be electrically connected to the source electrode SEL or may be deposited even on the inside of the pad opening PDOP to be placed even on a portion of the wire pad WPD in the pad area PDA that is exposed by the pad opening PDOP. The pixel electrode material layer may contact at least a portion of the top surface of the third data capping layer 144 disposed on an uppermost side of the first area 140A of the data conductive layer DCL. The pixel electrode material layer may contact at least a portion of the top surface of the third data capping layer 144 disposed in an uppermost layer of the wire pad WPD of the data conductive layer 140 in the pad area PDA.

A photoresist pattern PR, which has an identical pattern shape to the pixel electrode PXE, may be formed by applying a photoresist layer to the pixel electrode material layer and subjecting the photoresist layer to exposure and development. The pixel electrode material layer may be etched using the photoresist pattern PR as an etching mask. The pixel electrode material layer may be etched by wet etching, but the disclosure is not limited thereto.

A portion of the pixel electrode material layer where the photoresist pattern PR is disposed may be patterned by wet etching, and thus the pixel electrode PXE may be formed. A portion of the pixel electrode layer on the wire pad WPD of the data conductive layer DCL in the pad area PDA where the photoresist pattern PR is not disposed may be exposed to, and damaged by, an etchant used in the etching of the pixel electrode material layer. As a result, at least a portion of the third data capping layer 144 on the uppermost side of the wire pad WPD of the data conductive layer DCL in the pad area PDA may be exposed by the pad opening PDOP and may be removed by being exposed to the etchant used in the etching of the pixel electrode material layer. In this manner, the pad conductive layer 145 of FIG. 5 may be formed. The photoresist pattern PR may be removed by stripping or ashing.

Figure 19:
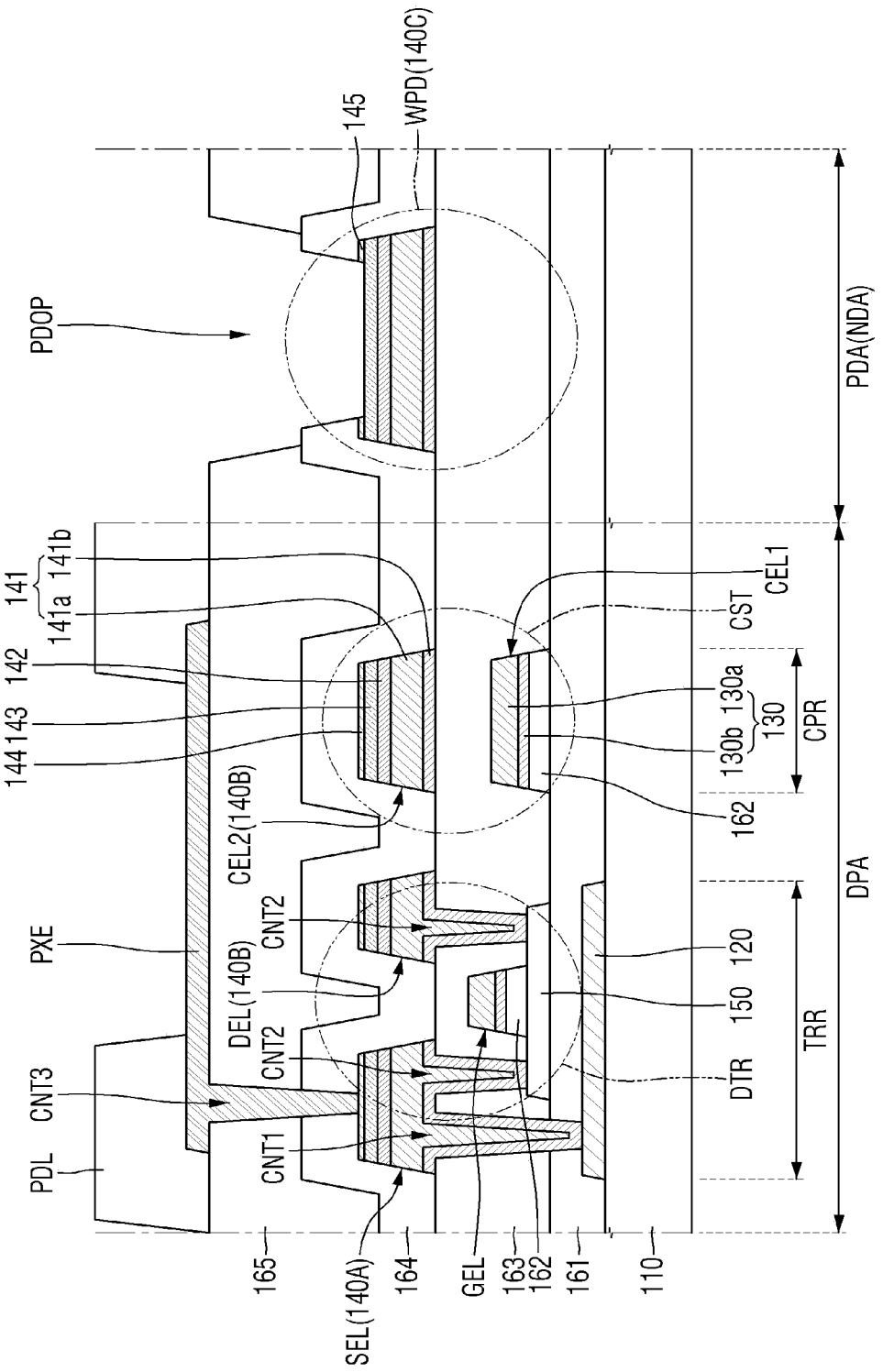

Referring to FIG. 19, the pixel-defining layer PDL, which is patterned, may be formed on the via layer 165 with the pixel electrode PXE formed thereon. The pixel-defining layer PDL may include, for example, an organic material that includes a photosensitive material. The pixel-defining layer PDL may be formed by applying an organic material layer for a pixel-defining layer and subjecting the organic material layer for the pixel-defining layer to exposure and development.

The pixel-defining layer PDL may be formed along the boundaries of each pixel PX and may partially overlap the pixel electrode PXE. The pixel-defining layer PDL may be formed to overlap the third contact hole CNT3. Although not specifically illustrated, if the pixel-defining layer PDL may fill a portion of the via layer 165 that has a relatively small height and may thus compensate for the difference in height with the rest of the via layer 165.

As the third data capping layer 144 is formed together with the data conductive metal layer 141 by a single mask process, the formation of tips of the first and second data capping layers 142 and 143 may be prevented, and a portion of the second data capping layer 143 exposed by the pad conductive layer 145 may be used as a contact electrode of the wire pad WPD. Therefore, as the formation of tips of the data conductive layer DCL may be prevented, cracks in multiple insulating layers disposed on the data conductive layer DCL may be prevented. As an additional mask process for forming the contact electrode of the wire pad WPD is not needed, process efficiency may be improved.

Display devices according to other embodiments will hereinafter be described, focusing mainly on the differences with the display device of FIG. 5. Repetitive descriptions of features or elements identical to those that have been described will be omitted or simplified.

Figure 20:
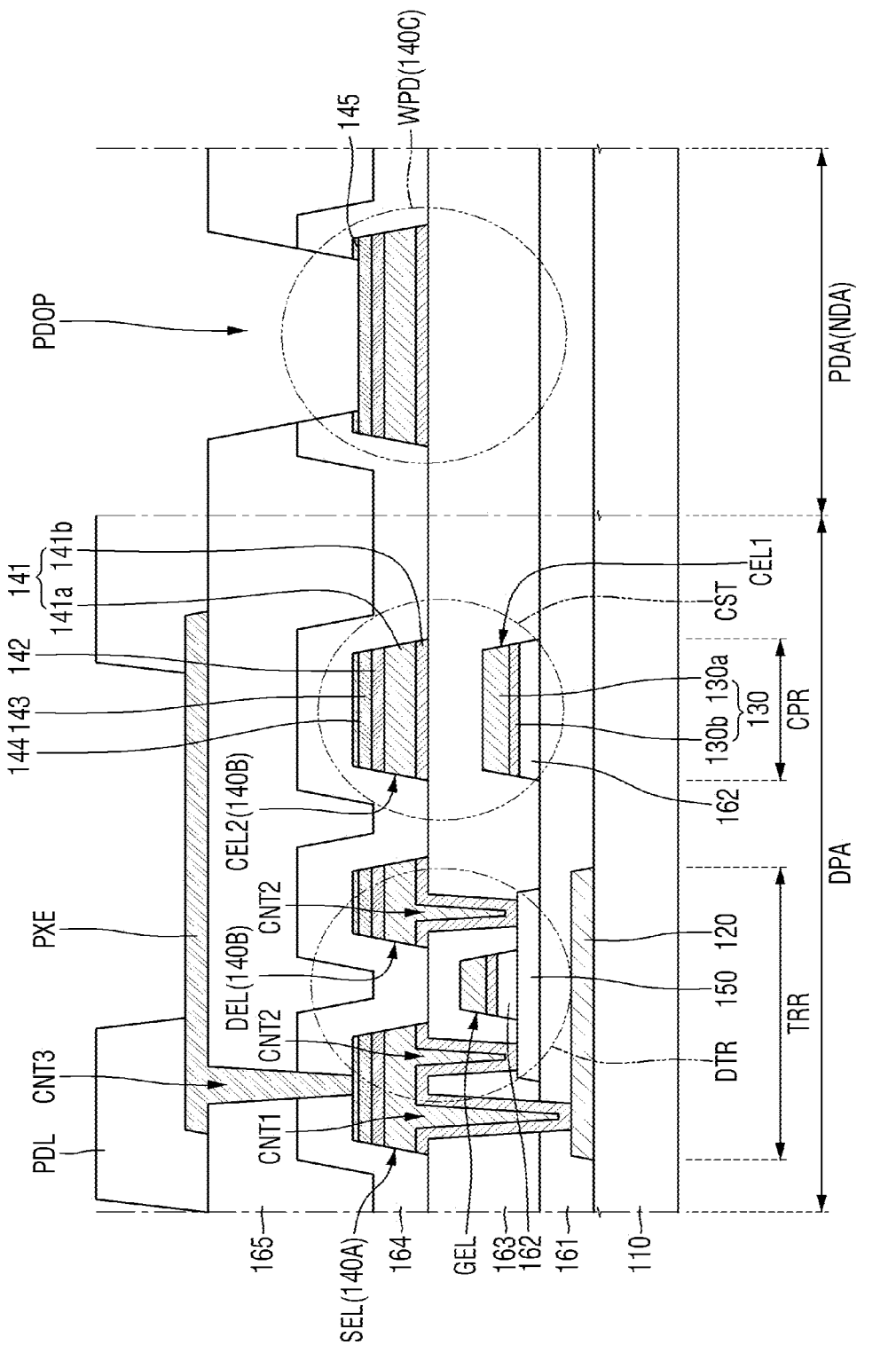
FIG. 20 is a schematic cross-sectional view of a first display substrate of a display device according to another embodiment of the disclosure.

FIG. 20 is a schematic cross-sectional view of a first display substrate of a display device according to an embodiment.

The embodiment of FIG. 20 may differ from the embodiment of FIG. 5 at least in the stacked structure or cross-sectional structure of a via layer 165 in a pad area PDA.

Referring to FIG. 20, the via layer 165 may include a pad opening PDOP, which exposes a third area 140C of a data conductive layer DCL in the pad area PDA, together with a passivation layer 164 disposed below the via layer 165. Sidewalls of the passivation layer 164 and sidewalls of the via layer 165 that form the inner sidewalls of the pad opening PDOP may be aligned with one another. The inner sidewalls of the pad opening PDOP may be aligned with inner sidewalls of a pad conductive layer 145 of the data conductive layer DCL. For example, the sidewalls of the passivation layer 164 and the sidewalls of the via layer 165 that form the inner sidewalls of the pad opening PDOP may be aligned with the inner sidewalls of the pad conductive layer 145 of the data conductive layer DCL.

As the passivation layer 164 and the via layer 165 are etched using a single mask pattern, the sidewalls of the passivation layer 164 and the sidewalls of the via layer 165 that form the inner sidewalls of the pad opening PDOP may be aligned with the inner sidewalls of the pad conductive layer 145 of the data conductive layer DCL.

Figure 21:
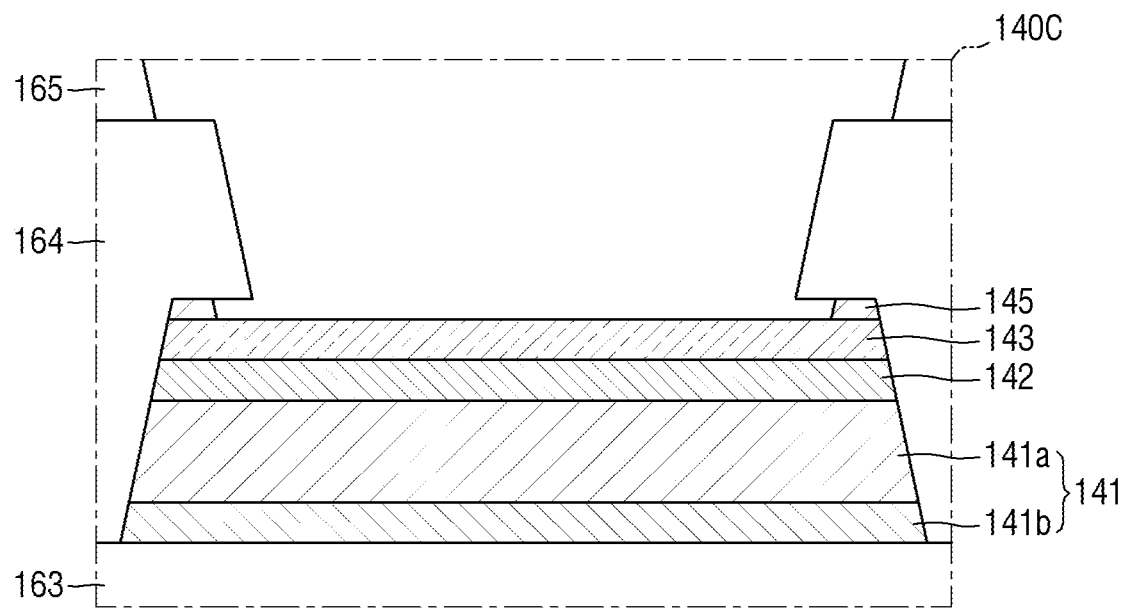
FIG. 21 is a schematic enlarged view of part A of FIG. 5.

FIG. 21 is a schematic enlarged view of part A (see FIG. 5) of a display device according to an embodiment.

FIG. 21 illustrates a third area 140C of a data conductive layer DCL in a pad area PDA.

The embodiment of FIG. 21 may differ from the embodiment of FIG. 5 at least in that in a third area 140C of a data conductive layer DCL, sidewalls of a pad conductive layer 145 are not aligned with corresponding sidewalls of a passivation layer 164.

Referring to FIG. 21, in the third area 140C of the data conductive layer DCL, portions of the passivation layer 164 may cover or overlap the top surface of the pad conductive layer 145, and portions of the passivation layer 164 may protrude outward beyond the pad conductive layer 145. Therefore, at least portions of the bottom surfaces of the portions of the passivation layer 164 that protrude outward beyond the pad conductive layer 145 may face the top surface of a second data capping layer 143, in an area that overlaps the second data capping layer 143.

The display device of FIG. 21 may be obtained in case that portion of a pixel electrode material layer in the pad area PDA is etched during an etching process for forming a pixel electrode PXE so that a third data capping layer of the data conductive layer DCL in the pad area PDA is exposed to an etchant for use in the etching process. In an example, if the third data capping layer is formed of a material having a relatively high etch rate such as Cu, the third data capping layer may be etched inwardly further than the sidewalls of the passivation layer 164, which is disposed on the data conductive layer DCL, and may thus be formed into the pad conductive layer 145.

Figure 22:
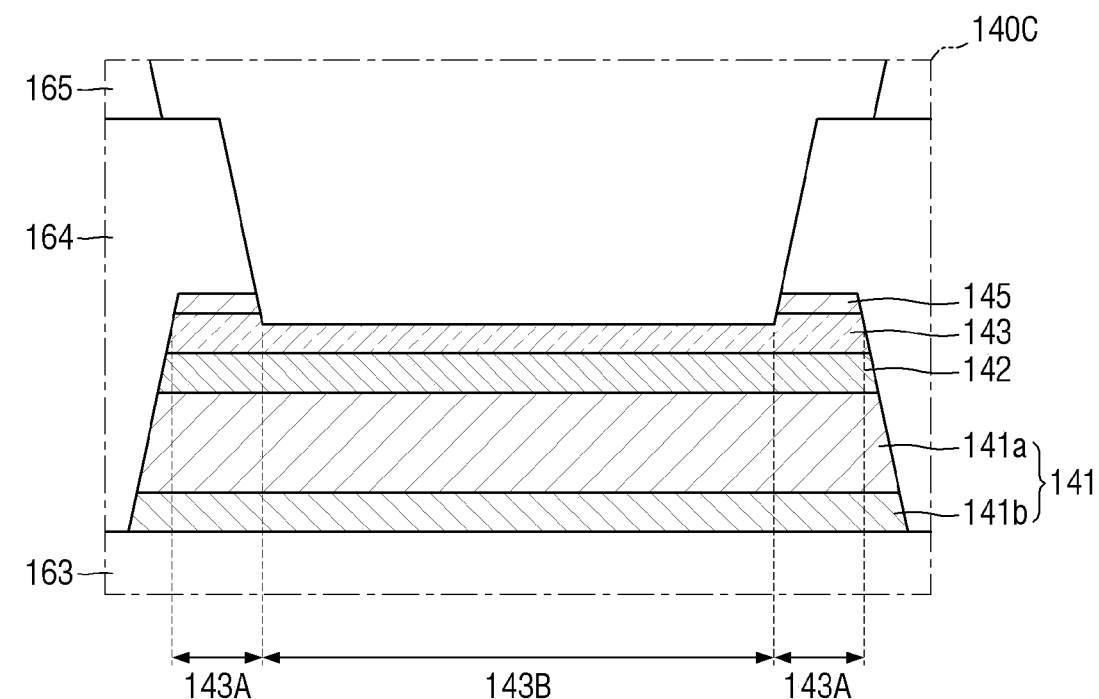
FIG. 22 is a schematic enlarged view of part A of FIG. 5.

FIG. 22 is a schematic enlarged view of part A (see FIG. 5) of a display device according to an embodiment.

FIG. 22 illustrates a third area 140C of a data conductive layer DCL in a pad area PDA. The embodiment of FIG. 22 may differ from the embodiment of FIG. 5 at least in that in the third area 140C of the data conductive layer DCL disposed in the pad area PDA, a second data capping layer 143 has surface steps having different thicknesses.

Referring to FIG. 22, in the third area 140C of the data conductive layer DCL, the second data capping layer 143 may include first sections 143A in an area that overlaps a passivation layer 164 and a second section 143B that is thinner than the first sections 143A. The second section 143B may be located in an area exposed by a pad opening PDOP. Therefore, side surfaces of the first sections 143A may be aligned with corresponding side surfaces of the passivation layer 164 and corresponding side surfaces of a pad conductive layer 145, and thus the pad opening PDOP may be formed in the pad area PDA.

The display device of FIG. 22 may be obtained in case that a portion of a pixel electrode material layer in the pad area PDA and a third data capping layer, which is disposed on the entire surface of the second data capping layer 143, are etched during an etching process for forming a pixel electrode PXE so that the second data capping layer 143 is exposed to an etchant for use in the etching process. In an example, at least a portion of the second data capping layer 143 may be etched in case that the pixel electrode material layer and the third data capping layer are being etched. If the second data capping layer 143 is formed of a material containing ITO, which has a relatively low etch rate, and is sufficiently thick, only a portion of the second data capping layer 143 may be etched, as illustrated in FIG. 22. Even in this case, a first data capping layer 142, which is disposed on a data main metal layer 141a, may remain on the data main metal layer 141a and thus may cover (or overlap) and protect the top surface of the data main metal layer 141a.

Figure 23:
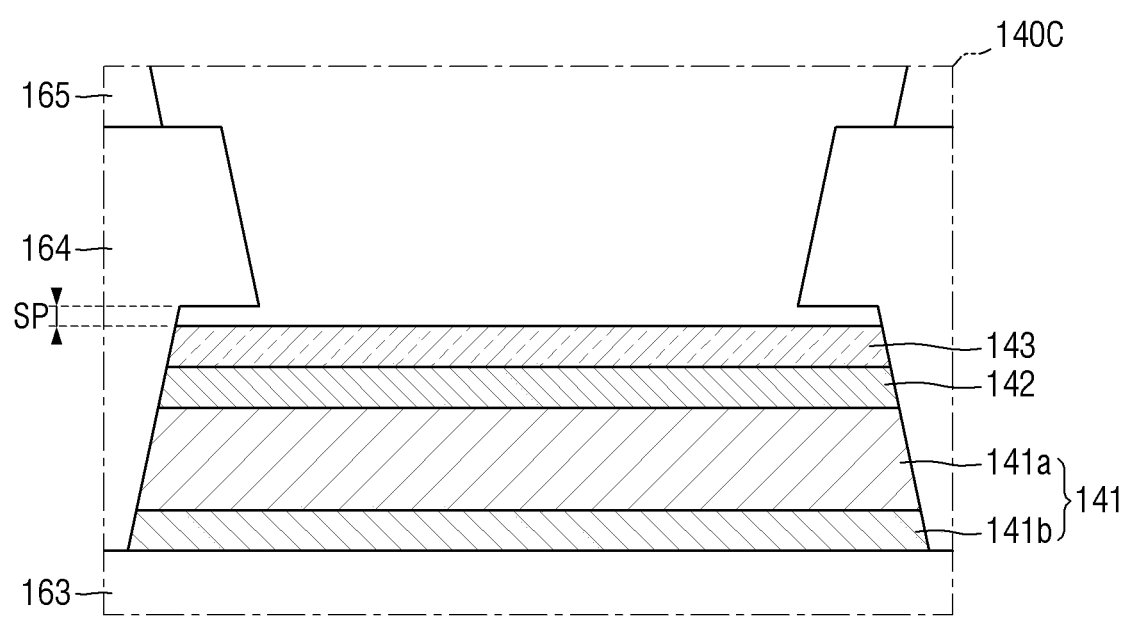
FIG. 23 is a schematic enlarged view of part A of FIG. 5.

FIG. 23 is a schematic enlarged view of part A (see FIG. 5) of a display device according to an embodiment.

FIG. 23 illustrates a third area 140C of a data conductive layer DCL in a pad area PDA.

The embodiment of FIG. 23 may differ from the embodiment of FIG. 5 at least in that the third area 140C of the data conductive layer DCL in the pad area PDA include no pad conductive layers.

Referring to FIG. 23, in the third area 140C of the data conductive layer DCL, pad conductive layers may not be disposed on a portion of a second data capping layer 143. A passivation layer 164 may be disposed on at least a portion of the top surface of the second data capping layer 143. Therefore, a portion of the top surface of the second data capping layer 143 that overlaps the passivation layer 164 may be exposed. A space SP may be formed between the passivation layer 164 and the second data capping layer 143 in a thickness direction, near the sidewalls of a pad opening PDOP.

The display device of FIG. 23 may be obtained in case that different material layers of the data conductive layer DCL that are sequentially stacked have different etch rates during the formation of patterns of the data conductive layer DCL. In an example, if the material of a material layer for a third data capping layer has a higher etch rate than the other material layers of the data conductive layer DCL for a same etchant, the material layer for the third data capping layer may be etched more quickly than the other layers of the data conductive layer DCL. The material layer for the third data capping layer may be etched more than the other layers of the data conductive layer DCL and third data capping layer material layer may be completely etched away during the etching of the data conductive layer DCL. In an example, after the formation of the data conductive layer DCL, which is patterned, the passivation layer 164, a via layer 165, and a pixel electrode PXE may be sequentially formed. During an etching process for forming the pixel electrode PXE, which is patterned, the material layer for a third data capping layer exposed by the pad opening PDOP may be completely removed by an etchant. Accordingly, the space SP may be formed between the passivation layer 164 and the second data capping layer 143 in the thickness direction, near the sidewalls of the pad opening PDOP.

Figure 24:
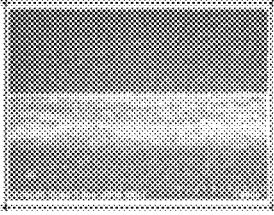
FIG. 24 shows images of different etching degrees of a data conductive layer pattern according to an embodiment of the disclosure for different etching durations.
Figure 25:
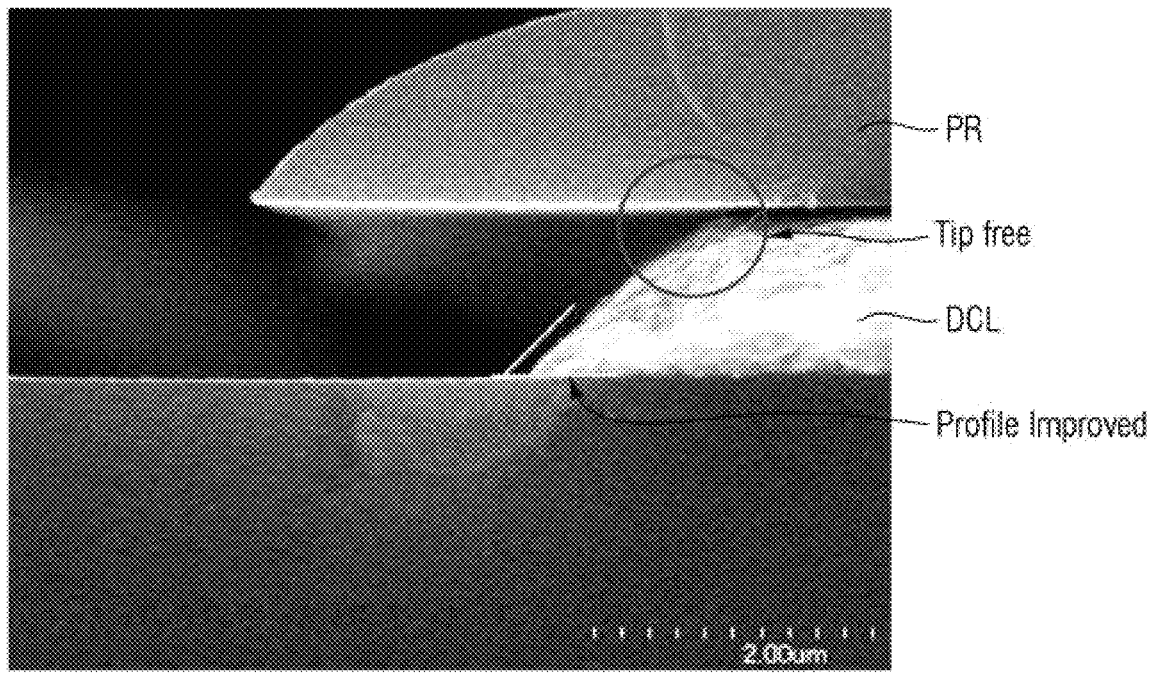
FIG. 25 shows an image of a data conductive pattern according to an embodiment of the disclosure.
Figure 26:
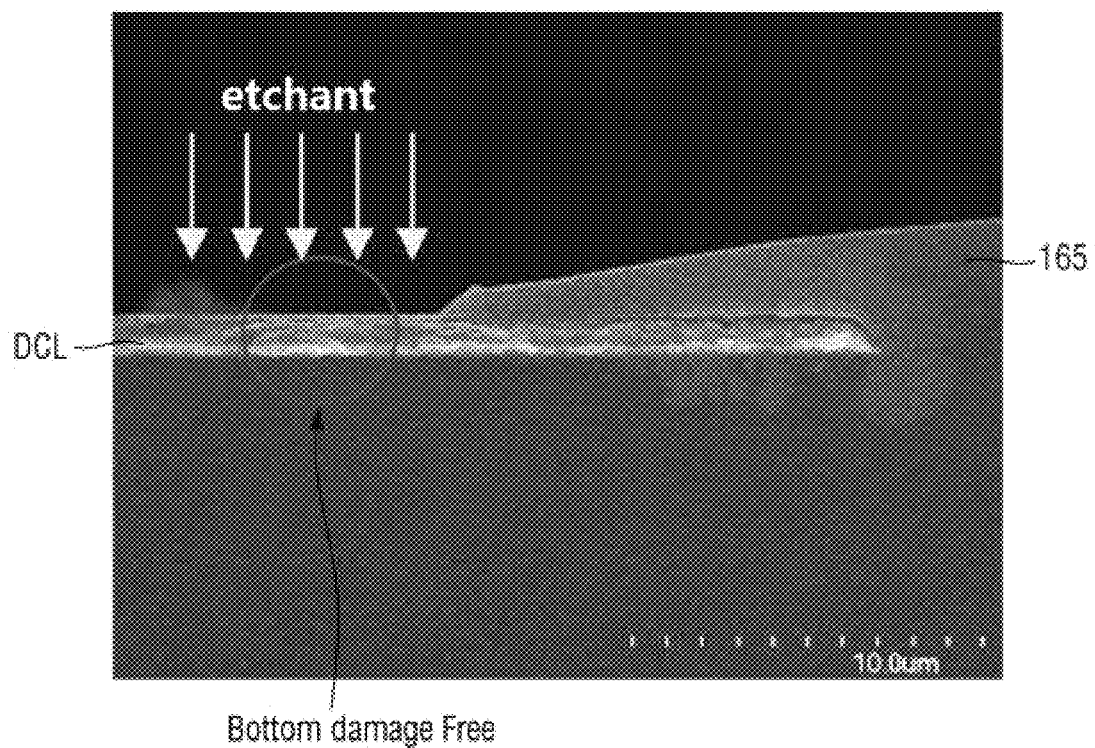
FIG. 26 shows an image of a wire pad during the etching of a pixel electrode according to an embodiment of the disclosure.

FIG. 24 illustrates images of different etching degrees of a data conductive layer pattern over time according to an embodiment for different etching durations. FIG. 25 illustrates an image of a data conductive pattern according to an embodiment. FIG. 26 illustrates an image of a wire pad during the etching of a pixel electrode according to an embodiment.

Specifically, FIGS. 24 and 25 are scanning electron microscope (SEM) images (or vertical-SEM images) illustrating the processes described above with reference to FIGS. 12 to 14, and FIG. 26 is an SEM image illustrating the process described above with reference to FIG. 18.

Referring to FIGS. 12 to 14 and 24, if the photoresist pattern PR is formed on the material layer 144' for the third data capping layer, and the material layer 144' for the third data capping layer is etched using an etchant and using the photoresist pattern PR as an etching mask, the material layer 144' for the third data capping layer may be etched first (20 sec).

The material layer 143' for the second data capping layer and the material layer 142' for the first data capping layer may be etched at similar speeds with their sidewalls aligned with one another. As the top surface of the material layer 143' for the second data capping layer, sidewalls of the material layer 143' for the second data capping layer and the material layer 142' for the first data capping layer, and the bottom surface of the material layer 142' for the first data capping layer are etched together, the material layer 143' for the second data capping layer and the material layer 142' for the first data capping layer may be etched quickly (25 sec).

As etching is continued, the sidewalls of the material layers 142', 143', and 144' for the first, second, and third data capping material layers are aligned with a corresponding sidewall(s) of the data main metal layer 141*a* (30 sec), and a data conductive layer pattern with an improved profile may be fabricated (35 sec).

Specifically, as shown in FIG. 25, it can be seen that the data conductive layer pattern may have an improved profile and prevent the formation of tips.

Referring to FIGS. 18 and 26, as the material layer 144' for the third data capping layer is etched by an etchant during the etching of a pixel electrode material layer, the material layer 143' for the second data capping layer may be exposed to the etchant. If the material layer 143' for the second data capping layer is formed of ITO, the etchant may penetrate into the material layer 142' for the first data capping layer through pin holes present in the material layer 143' for the second data capping layer. However, the penetration of the etchant into the material layer 142' for the first data capping layer may be prevented, and thus the data main metal layer 141*a* may be prevented from being damaged by the etchant.

As illustrated in FIG. 26, it can be seen that the data conductive layer DCL, which includes the data main metal layer 141*a*, is not damaged by the etchant.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a substrate including a display area and a pad area;
   a data conductive layer disposed on the substrate;
   a passivation layer disposed on the data conductive layer;
   a via layer disposed on the passivation layer; and
   a pixel electrode disposed on the via layer, wherein
   the data conductive layer includes:
     a data base layer;
     a data main metal layer disposed on the data base layer;
     a first data capping layer disposed on the data main metal layer;
     a second data capping layer disposed on the first data capping layer; and
     a third data capping layer disposed on the second data capping layer,
   the passivation layer and the via layer include a pad opening which exposes a portion of the data conductive layer in the pad area,
   the third data capping layer has a higher etch rate than the first and second data capping layers for a same etchant in a mask process in which the first, second, and third data capping layers are formed, and
   the third data capping layer includes a pad conductive layer which exposes the second data capping layer through the pad opening.

2. The display device of claim 1, wherein the third data capping layer has a twice higher etch rate than the first and second data capping layers for the same etchant in the mask process.

3. The display device of claim 2, wherein the third data capping layer includes copper (Cu) or zinc indium oxide (ZIO).

4. The display device of claim 3, wherein the data main metal layer and the third data capping layer include copper.

5. The display device of claim 3, wherein the third data capping layer has a thickness in a range of about 10 Å to about 100 Å.

6. The display device of claim 3, wherein the data base layer and the first data capping layer include a same material and include at least one of titanium (Ti), tantalum (Ta), calcium (Ca), chromium (Cr), magnesium (Mg), and nickel (Ni).

7. The display device of claim 6, wherein the data base layer and the first data capping layer include titanium.

8. The display device of claim 3, wherein the second data capping layer includes indium tin oxide (ITO).

9. The display device of claim 1, wherein side surfaces of each layer of the data conductive layer are aligned with each other.

10. The display device of claim 1, wherein side surfaces of the passivation layer are aligned with corresponding side surfaces of the pad conductive layer.

11. The display device of claim 1, wherein
   the passivation layer overlaps the pad conductive layer, and
   side surfaces of the passivation layer protrude outwardly beyond side surfaces of the pad conductive layer.

12. A display device comprising:
   a substrate including a display area and a pad area;
   a data conductive layer disposed on the substrate;
   a passivation layer disposed on the data conductive layer;
   a via layer disposed on the passivation layer; and
   a pixel electrode disposed on the via layer, wherein
   the data conductive layer includes:
     a data base layer;
     a data main metal layer disposed on the data base layer;
     a first data capping layer disposed on the data main metal layer;
     a second data capping layer disposed on the first data capping layer; and
     a third data capping layer disposed on the second data capping layer,
   the passivation layer and the via layer include:
     a first contact hole which penetrates the passivation layer and the via layer in a thickness direction to expose a portion of the data conductive layer in the display area; and
     a pad opening which exposes a portion of the data conductive layer in the pad area,
   the data conductive layer includes:
     a first area which overlaps the passivation layer;
     a second area which overlaps the first contact hole; and
     a third area which overlaps the pad opening,
   the third data capping layer is disposed in the entire first and second areas of the data conductive layer, and
   the third data capping layer includes a pad conductive layer which does not overlap the pad opening in the third area of the data conductive layer.

13. The display device of claim 12, wherein the third data capping layer contacts the pixel electrode in the second area of the data conductive layer.

14. The display device of claim 12, further comprising:
   a lower metal layer disposed on the substrate below the first area of the data conductive layer; and
   at least one insulating layer disposed between the data conductive layer and the lower metal layer.

15. The display device of claim 14, wherein
   the at least one insulating layer includes a contact hole which penetrates the at least one insulating layer in the thickness direction to expose the lower metal layer, and the lower metal layer is electrically connected to the data conductive layer through the contact hole.

16. The display device of claim 12, wherein portions of the third data capping layer in the first and second areas of the data conductive layer and the pad conductive layer in the third area of the data conductive layer include a same material.

17. The display device of claim 12, wherein the third data capping layer has a higher etch rate than the first and second data capping layers for a same etchant in a mask process in which the first, second, and third data capping layers are formed.

18. The display device of claim 17, wherein the third data capping layer includes copper (Cu) or zinc indium oxide (ZIO).

19. The display device of claim 18, wherein the data main metal layer and the third data capping layer include copper.

20. The display device of claim 18, wherein the third data capping layer has a thickness in a range of about 10 Å to about 100 Å.

\* \* \* \* \*